US 6,593,177 B2

(12) United States Patent
Lee

(10) Patent No.: US 6,593,177 B2
(45) Date of Patent: Jul. 15, 2003

(54) SELF ALIGNED METHOD OF FORMING A SEMICONDUCTOR MEMORY ARRAY OF FLOATING GATE MEMORY CELLS, AND A MEMORY ARRAY MADE THEREBY

(75) Inventor: Dana Lee, Santa Clara, CA (US)

(73) Assignee: Silicon Storage Technology, Inc., Sunnyvale, CA (US)

(*) Notice: Subject to any disclaimer, the term of this patent is extended or adjusted under 35 U.S.C. 154(b) by 4 days.

(21) Appl. No.: 09/972,179

(22) Filed: Oct. 5, 2001

(65) Prior Publication Data

US 2002/0011608 A1 Jan. 31, 2002

Related U.S. Application Data

(63) Continuation of application No. 09/401,173, filed on Sep. 22, 1999, now Pat. No. 6,329,685.

(51) Int. Cl.⁷ .............................................. H01L 29/64
(52) U.S. Cl. ........................ 438/201; 438/211; 438/257; 438/694
(58) Field of Search .................................. 438/201, 211, 438/257, 694, 314, 315

(56) References Cited

U.S. PATENT DOCUMENTS 6,103,573 A * 8/2000 Harari et al. ............... 438/257

* cited by examiner

Primary Examiner—Edward Wojciechowicz
(74) Attorney, Agent, or Firm—Gray, Cary, Ware & Freidenrich

(57) ABSTRACT

A self aligned method of forming a semiconductor memory array of floating gate memory cells in a semiconductor substrate has a plurality of spaced apart isolation regions on the substrate substantially parallel to one another. An active region is between each pair of adjacent isolation regions. The active and isolation regions are formed in parallel and in the column direction. In the row direction, strips of spaced apart silicon nitride are formed. A source line plug is formed between adjacent pairs of silicon nitride and is in contact with a first region in the active regions, and the isolation regions. The strips of silicon nitride are removed and isotropically etched. In addition, the materials beneath the silicon nitride are also isotropically etched. Polysilicon spacers are then formed in the row direction parallel to the source line plug and adjacent to the floating gates. A second region is formed between adjacent, spaced apart, control gates. A bit line is formed in the bit line direction contacting the second region in the space between the control gates.

19 Claims, 22 Drawing Sheets

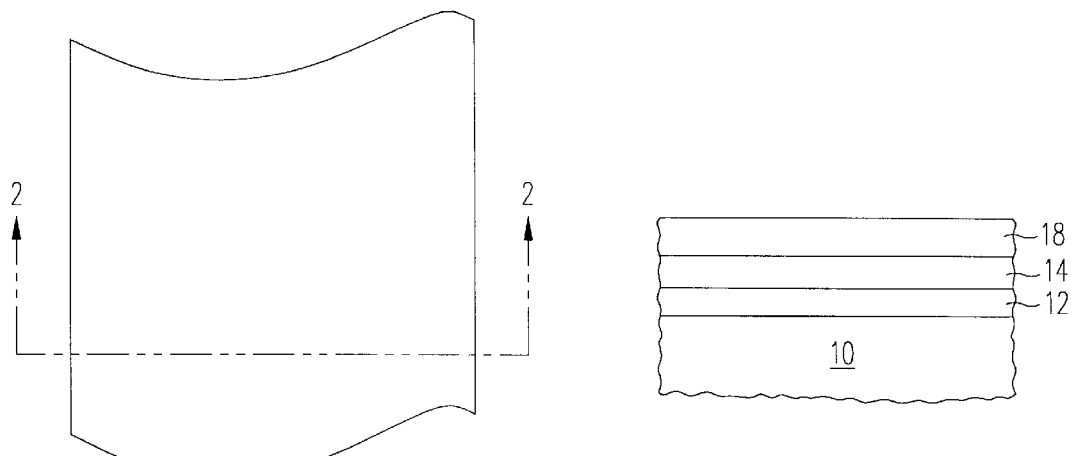
FIG. 1a-1
FIG. 1a-2
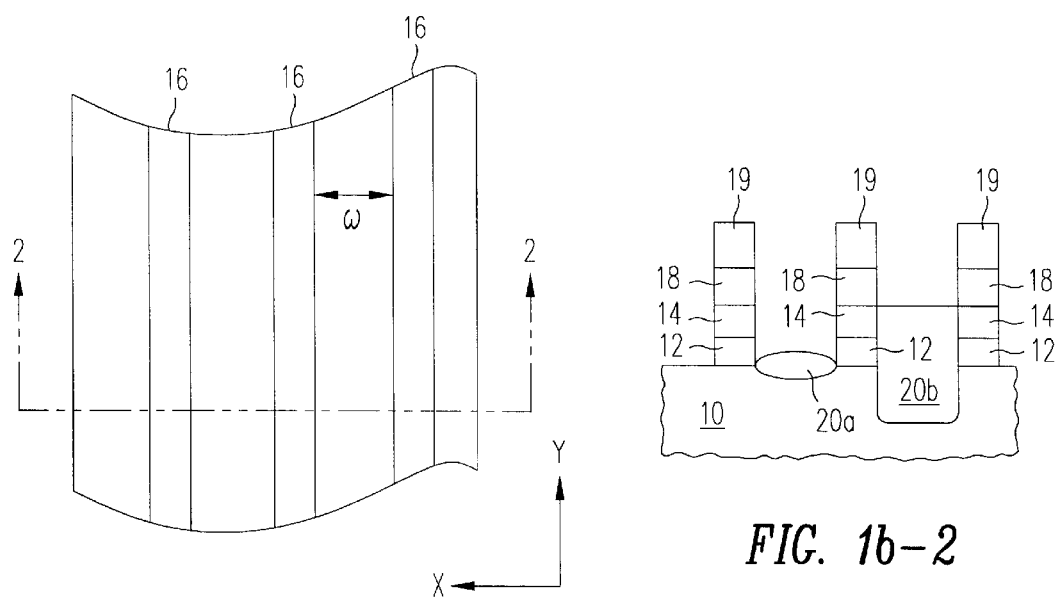
FIG. 1b-1
FIG. 1b-2

US 6,593,177 B2

SELF ALIGNED METHOD OF FORMING A SEMICONDUCTOR MEMORY ARRAY OF FLOATING GATE MEMORY CELLS, AND A MEMORY ARRAY MADE THEREBY

CROSS REFERENCE TO RELATED APPLICATIONS

This application is a continuation of and claims the benefit of U.S. application Ser. No. 09/401,173, filed Sep. 22, 1999, the disclosure of which is incorporated herein by reference now U.S. Pat. No. 6,329,685.

TECHNICAL FIELD

The present invention relates to a self-aligned method of forming a semiconductor memory array of floating gate memory cells of the split gate type, stack gate type or a combination thereof. The present invention also relates to a semiconductor memory array of floating gate memory cells of the forgoing types.

BACKGROUND OF THE INVENTION

Non-volatile semiconductor memory cell using a floating gate to store charges thereon and memory arrays of such non-volatile memory cells formed in a semiconductor substrate are well known in the art. Typically, such floating gate memory cells have been of the split gate type, or stacked gate type, or a combination thereof.

One of the problems facing the manufacturability of semiconductor floating gate memory cell arrays has been the alignment of the various components such as source, drain, control gate, and floating gate. As the scale of integration of semiconductor processing increases, reducing the largest lithographic feature, the need for precise alignment becomes more critical. Alignment of various parts also determines the yield of the manufacturing of the semiconductor products.

Self-alignment is well known in the art. Self-alignment refers to the act of processing one or more steps involving one or more materials such that the features are automatically aligned with respect to one another in that step processing. Accordingly, the present invention uses the technique of self-alignment to achieve the manufacturing of a semiconductor memory array of the floating gate memory cell type.

SUMMARY OF THE INVENTION

In the present invention, three self-aligned methods are disclosed to form semiconductor memory arrays of floating gate memory cells of the split gate type, stacked gate type, and a combination thereof, as well as such memory arrays formed thereby. In the self aligned method of forming a semiconductor memory array of floating gate memory cells of the split gate type, the memory cell has a first terminal, a second terminal with a channel between the first terminal and the second terminal, a floating gate, and a control gate. In the method, a plurality of spaced apart isolation regions are formed in the substrate. The isolation regions are substantially parallel to one another in a first direction with an active region between each pair of adjacent isolation regions. Each active region has a first layer of insulating material on the semiconductor substrate, and a first layer of polysilicon material on the first layer of insulating material. A plurality of spaced apart masking regions of a masking material are formed substantially parallel to one another on said semiconductor substrate in a second direction crossing a plurality of alternating active regions and isolation regions. The second direction is substantially perpendicular to the first direction. Etching along the second direction under the masking material is then performed. A plurality of spaced apart first spacers of an insulating material are formed substantially parallel to one another in the second direction. Each of the first spacers is adjacent to and contiguous with one of the masking regions with a first region between each pair of adjacent first spacers. Each first spacer crossing a plurality of alternating active regions and isolation regions. Between each pair of adjacent first spacers in the first region, the material is etched. A first terminal is formed in the substrate in the active region between pairs of adjacent first spacers in the first region. A conductor is formed in the second direction between each pair of spaced apart first spacers, electrically connected to the first terminal in the substrate. The masking material is removed resulting in a plurality of spaced apart structures substantially parallel to one another in the second direction. An insulating film is formed about each of these structures. A plurality of spaced apart second spacers of polysilicon material substantially parallel to one another is formed in the second direction. Each second spacer is adjacent to and contiguous with one of the structures. A second region is between each pair of adjacent second spacers with each second spacer crossing a plurality of alternating active regions and isolation regions. Each of the second spacer electrically connects the control gates for the memory cells in the second direction. Between each pair of adjacent second spacers in the second region, the material is etched. A second terminal is formed in the substrate in each of the active regions between pairs of adjacent second spacers in the second region. Finally, a conductor is formed in a first direction substantially parallel to an active region and electrically connected to the second terminals in the first direction.

A semiconductor memory array of a floating gate memory cell of the split gate type is formed by the foregoing method.

BRIEF DESCRIPTION OF THE DRAWINGS

FIG. 1a-1 is a top view of a semiconductor substrate used in the first step of the method of present invention to form isolation regions.

FIG. 1a-2 is a cross sectional view taken along the line 2—2.

FIG. 1b-1 is a top view of the next step in the processing of the structure of FIG. 1a-1, in which isolation regions are formed.

FIG. 1b-2 is a cross sectional view taken along the line 2—2 showing the two types of isolation region that can be formed in the semiconductor substrate: LOCOS or shallow trench.

FIG. 1c-1 is a top view showing the next step in the processing of the structure shown in FIG. 1b-1 to form isolation regions.

FIG. 1c-3 is a cross sectional view taken along the line 3—3.

FIG. 1c-4 is a cross sectional view taken along the line 4—4.

FIG. 2a-4 is a cross sectional view taken along the line 4—4 in the next step in the processing of the structure shown in FIG. 1c-1, in the formation of non volatile memory array of floating memory cells of the split gate type.

FIG. 2b-4 is a cross sectional view taken along the line 4—4 in the next step in the processing of the structure shown in FIG. 2a-4, in the formation of non volatile memory array of floating memory cells of the split gate type.

FIG. 2c-4 is a cross sectional view taken along the line 4—4 in the next step in the processing of the structure shown in FIG. 2b-4, in the formation of non volatile memory array of floating memory cells of the split gate type.

FIG. 2d-4 is a cross sectional view taken along the line 4—4 in the next step in the processing of the structure shown in FIG. 2c-4, in the formation of non volatile memory array of floating memory cells of the split gate type.

FIG. 2e-4 is a cross sectional view taken along the line 4—4 in the next step in the processing of the structure shown in FIG. 2d-4, in the formation of non volatile memory array of floating memory cells of the split gate type.

FIG. 2f-4 is a cross sectional view taken along the line 4—4 in the next step in the processing of the structure shown in FIG. 2e-4, in the formation of non volatile memory array of floating memory cells of the split gate type.

FIG. 2g-4 is a cross sectional view taken along the line 4—4 in the next step in the processing of the structure shown in FIG. 2f-4, in the formation of non volatile memory array of floating memory cells of the split gate type.

FIG. 2h-4 is a cross sectional view taken along the line 4—4 in the next step in the processing of the structure shown in FIG. 2g-4, in the formation of non volatile memory array of floating memory cells of the split gate type.

FIG. 2i-4 is a cross sectional view taken along the line 4—4 in the next step in the processing of the structure shown in FIG. 2h-4, in the formation of non volatile memory array of floating memory cells of the split gate type.

FIG. 2j-1 is a top view showing the interconnection of row lines and bit lines to terminals in active regions in the formation of the non volatile memory array of floating memory cells of the split gate type.

FIG. 3 is a cross sectional view taken along the line 4—4, and is similar to FIG. 1c-4 showing the result of a variation in the processing step to form an undercut in the insulating material.

FIG. 4a-1 is a top view of a semiconductor substrate used in the first step of the method of present invention to form isolation regions in an array of non-volatile memory cells with floating gate memory cells of the stacked gate type.

FIG. 4a-2 is a cross sectional view taken along the line 2—2 shown in FIG. 4a-1.

FIG. 4b-1 is the next step in the formation of an array of floating gate memory cells of the stacked gate type in which isolation regions are formed in the structure of FIG. 4a-1.

FIG. 4b-2 is a cross sectional view taken along the line 2—2 shown in FIG. 4a-1 showing the isolation regions and active regions.

FIG. 4c-1 is a top view showing the next step in the formation of a non volatile memory array of the stacked gate type.

FIG. 4c-3 is a cross sectional view taken along the line 3—3 of the structure shown in FIG. 4c-1.

FIG. 4c-4 is a cross sectional view taken along the line 4—4 of the structure shown in FIG. 4c-1.

FIG. 5a-4 is a cross sectional view taken along the line 4—4 in the next step in the formation of the non volatile memory array of floating memory cells of the stacked gate type.

FIG. 5b-4 is a cross sectional view taken along the line 4—4 showing the next step in processing the structure shown in FIG. 5a-4, in the formation of the non volatile memory array of floating memory cells of the stacked gate type.

FIG. 5c-4 is a cross sectional view taken along the line 4—4 showing the next step in processing the structure shown in FIG. 5b-4 in the formation of the non volatile memory array of floating memory cells of the stacked gate type.

FIG. 5d-4 is a cross sectional view taken along the line 4—4 showing the next step in processing the structure shown in FIG. 5c-4 in the formation of the non volatile memory array of floating memory cells of the stacked gate type in which bit line and drain regions are formed.

FIG. 6a-4 is a cross sectional view taken along the line 4—4 showing the result of processing the structure shown in FIG. 3, in the formation of a non volatile memory array of floating gate memory cells of a combination of stacked gate and split gate type.

FIG. 6b-4 is a cross sectional view taken along the line 4—4 showing the next step in processing the structure shown in FIG. 6a4, in the formation of a non volatile memory array of floating gate memory cells of a combination of stacked gate and split gate type.

FIG. 6c-4 is a cross sectional view taken along the line 4—4 showing the next step in processing the structure shown in FIG. 6b-4, in the formation of a non volatile memory array of floating gate memory cells of a combination of stacked gate and split gate type.

FIG. 6d-4 is a cross sectional view taken along the line 4—4 showing the next step in processing the structure shown in FIG. 6c-4, in the formation of a non volatile memory array of floating gate memory cells of a combination of stacked gate and split gate type.

FIG. 6e-4 is a cross sectional view taken along the line 4—4 showing the next step in processing the structure shown in FIG. 6d-4, in the formation of a non volatile memory array of floating gate memory cells of a combination of stacked gate and split gate type.

FIG. 6f-4 is a cross sectional view taken along the line 4—4 showing the next step in processing the structure shown in FIG. 6e-4, in the formation of a non volatile memory array of floating gate memory cells of a combination of stacked gate and split gate type.

FIG. 6g-4 is a cross sectional view taken along the line 4—4 showing the next step in processing the structure shown in FIG. 6f-4, in the formation of a non volatile memory array of floating gate memory cells of a combination of stacked gate and split gate type.

FIG. 6h-4 is a cross sectional view taken along the line 4—4 showing the next step in processing the structure shown in FIG. 6g-4 in the formation of a non volatile memory array of floating gate memory cells of a combination of stacked gate and split gate type.

FIG. 6i-4 is a cross sectional view taken along the line 4—4 showing the next step in processing the structure shown in FIG. 6h-4 in the formation of a non volatile memory array of floating gate memory cells of a combination of stacked gate and split gate type.

FIG. 7a-4 is a cross sectional view taken along the line 4—4 showing the structure formed in FIG. 2e-4, 5c-4, or 6h-4, in the first step in the method of the present invention to form self-aligned bit lines.

FIG. 7b-4 is a cross sectional view taken along the line 4—4 showing the next step in processing the structure shown in FIG. 7a-4, in the formation of self-aligned bit lines.

FIG. 7c-4 is a cross sectional view taken along the line 4—4 showing the next step in processing the structure shown in FIG. 7b-4, in the formation of self-aligned bit lines.

FIG. 7d-4 is a cross sectional view taken along the line 4—4 showing the next step in processing the structure shown in FIG. 7c-4, in the formation of self-aligned bit lines.

FIG. 7e-4 is a cross sectional view taken along the line 4—4 showing the next step in processing the structure shown in FIG. 7d-4, in the formation of self-aligned bit lines.

FIG. 7f-4 is a cross sectional view taken along the line 4—4 showing the next step in processing the structure shown in FIG. 7e-4, in the formation of self-aligned bit lines.

DETAILED DESCRIPTION OF THE DRAWINGS

Figures 1, 1C:
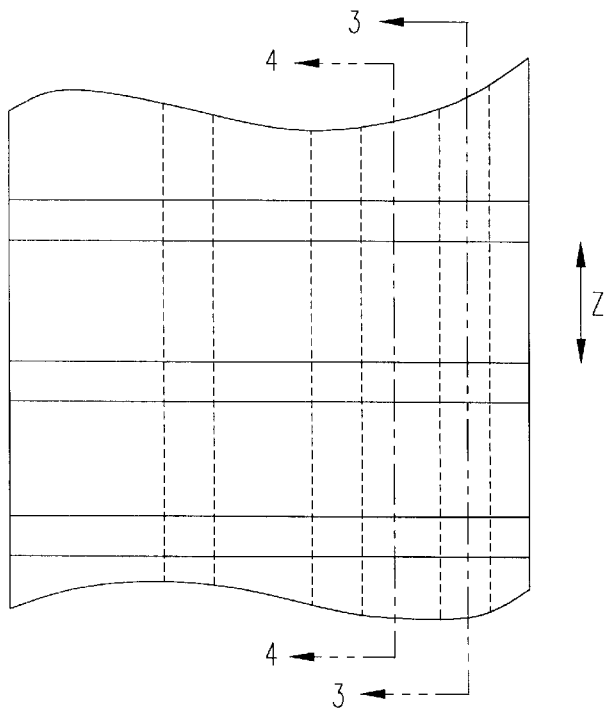

Referring to FIG. 1a-1 there is shown a top plan view of a semiconductor substrate 10 having a first layer of insulating material 12, such as silicon dioxide deposited thereon. A first layer of polysilicon 14 is deposited on the first layer of insulating material 12. The semiconductor substrate 10 is preferably of P type and is well known in the art. The first insulating layer 12 is formed on the substrate 10 by well known techniques such as oxidation or deposition (e.g. chemical vapor deposition or CVD), forming a layer of silicon dioxide of approximately 80–90 Å in thickness. Similarly, the deposition and formation of the first polysilicon layer 14 on the first insulating layer 12 can be made by well known process such as Low Pressure CVD or LPCVD resulting in a layer of approximately 500–700 Å thickness of polysilicon 14 on the first insulating layer 12. A silicon nitride layer 18 of preferably 500 Å is deposited by CVD. This layer 18 is used to define the active regions during isolation formation. Of course, all of the forgoing described parameters and the parameters described hereinafter, depend upon the design rules and the process technology generation. What is described herein is for the 0.18 micron process. However, it will be understood by those skilled in the art that the present invention is not limited to any specific process technology generation, nor to any specific value in any of the process parameters described hereinafter.

Once the first insulating layer 12, the first polysilicon layer 14, and the silicon nitride 18 have been formed, suitable photo-resistant material 19 is applied on the silicon nitride layer 18 and a masking step is performed to etch the silicon nitride 18, the first polysilicon 14, and the underlying first insulating layer 12 in selective regions. Where the photo resist 19 is not removed, they remain on top of the silicon nitride 18, the first polysilicon region 14 and the underlying insulating region 12. Where the photo-resist material 19 is removed, the silicon nitride 18, the polysilicon 14 and the underlying insulating material 12 are etched away in strips 16 formed in the Y direction or the column direction, as shown in FIG. 1b-1. (As will be described, there are two embodiments in the formation of the isolation regions: LOCOS and STI. In the STI embodiment, the etching continues into the substrate 10 to a depth of approximately 2800 Å). The distance W between adjacent strips 16 can be as small as the smallest lithographic feature of the process used.

Figures 1, 1C, 2, 3, 4:
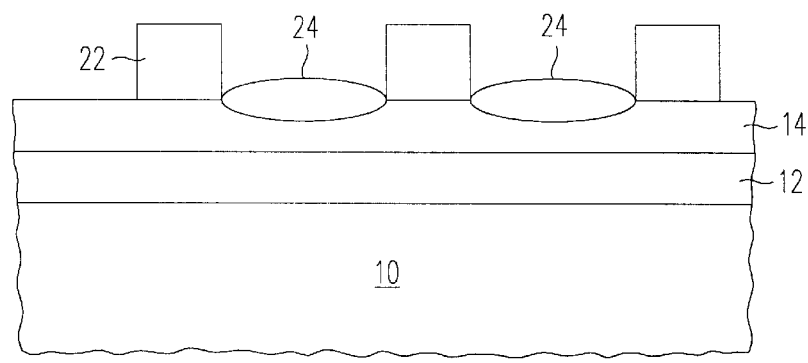
Figures 1, 1C, 2, 3:
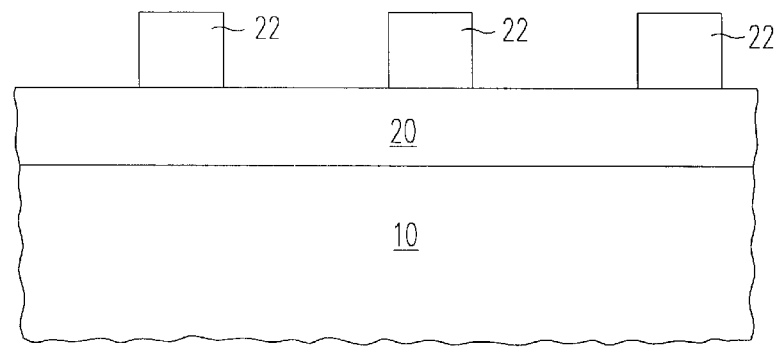
Figure 3:
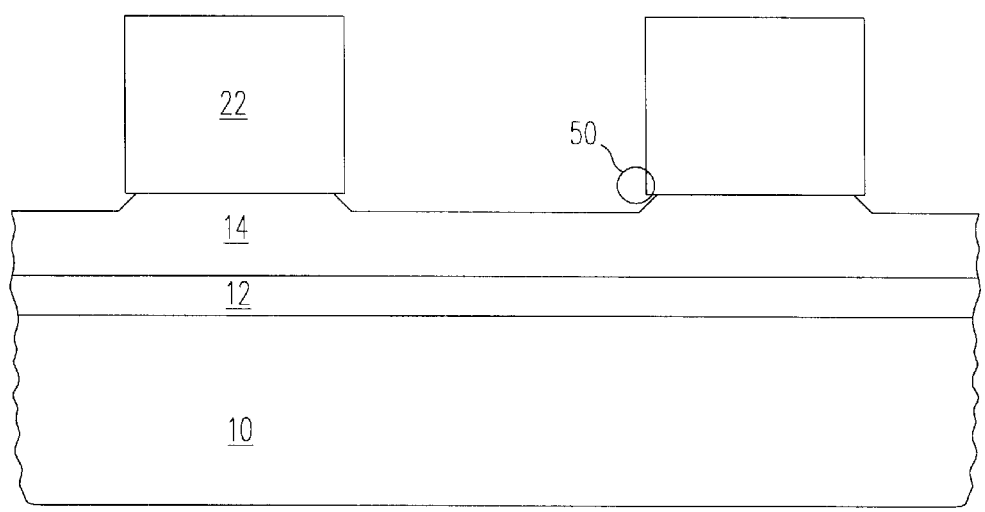

After the silicon nitride 18, the first polysilicon 14 and the first insulating layer 12 are etched away in strips 16, the regions or "grooves" 16 in the semiconductor substrate 10 are filled with an isolation material 20a or 20b, such as silicon dioxide. As shown in FIG. 1b-2, this can be the well known LOCOS process resulting in the local field oxide 20a or it can be a shallow trench process (STI) resulting in silicon-dioxide being formed in the region 20b. Where the photo-resist 19 has not been removed, the semiconductor substrate 10 beneath the silicon nitride 18, the first polysilicon 14 and the underlying first insulating material 12 forms the active region. Thus, at this point, the substrate 10 has alternating strips of active regions and isolation regions with the isolation region being formed of either LOCOS 20a or shallow trench 20b. It should be noted that although FIG. 1b-2 shows the formation of both a LOCOS region 20a and a shallow trench region 20b, only one of either the LOCOS process 20a or the shallow trench 20b will be used. In the preferred embodiment, the shallow trench 20b will be formed. Shallow trench 20b is desirable because it can be formed planar with respect to the first polysilicon layer 14. The structure at this point represents a self-aligned floating gate to active.

This structure is more compact than a structure formed by a non self-aligned method. A non self-aligned method of forming the structure shown in FIG. 1b, which is well known and is conventional, is as follows. Regions of isolation 20 are first formed in the substrate 10. This can be done by depositing a layer of silicon nitride on the substrate 10, depositing photoresist patterning the silicon nitride to expose selective portions of the substrate 10, and then oxidizing the exposed substrate 10 using either the LOCOS process or the STI process. Thereafter, the silicon nitride is removed, and a first layer of silicon dioxide 12 (to form the gate oxide) is deposited over the substrate 10. A first layer of polysilicon 14 is deposited over the gate oxide 12. The first layer of polysilicon 14 is then patterned and selective portions removed. Thus, the polysilicon 14 is not self aligned with the regions of isolation 20, and a second masking step is required. Further, the additional masking step requires that the dimensions of the polysilicon 14 have an alignment tolerance with respect to the regions of isolation 20.

With the structure shown in FIG. 1b made using either the self aligned method or the non self-aligned method, the structure is further processed as follows.

Referring to FIG. 1c-1, there is shown the top view of the next step in the process of the present invention. A masking layer 22, such as silicon nitride 22, is applied across the entire surface of the structure shown in FIG. 1b-1. A second masking operation is performed with photo-resist applied on top of the silicon nitride 22. A mask in which strips are defined in the X or the row direction is applied. The distance Z between adjacent strips can be a size determined by the needs of the device to be fabricated. The proposed structure can contain three "features", i.e. two gates and one "space" within the distance Z. The photo resist is removed in selective regions, i.e. strips in the row direction. The exposed masking material, or silicon nitride 22 is then etched, resulting in the structure shown in FIG. 1c-1. In the process, each strip of silicon nitride 22 crosses over an active region in the semiconductor substrate 10 over which lies a first insulating layer 12 and a polysilicon layer 14, and over an isolation region in the semiconductor substrate 10, consisting of the shallow trench silicon dioxide 20. In addition, between each strips of silicon nitride 22 is a groove crossing over the shallow trench 20 and over an oxidized region of the first polysilicon 14, shown as 24 in FIG. 1c-4. The material 24 is the same silicon dioxide as that which is formed as the isolation region 20 in the shallow trench. The formation of the strips of silicon nitride 22 can be as follows:

The silicon nitride 22 is applied on the structure shown in FIG. 1b-1 by CVD in which a layer of approximately 3000 Å in thickness of silicon nitride 22 is formed on the structure.

Thereafter the silicon nitride 22 is etched selectively. The first polysilicon layer 14 and silicon dioxide regions 20a or 20b form etch stops thereby stopping the etching process. Finally, the exposed first polysilicon 14 is then oxidized to form the silicon dioxide 24.

A second layer 26 of insulating material, such as silicon dioxide deposited from the decomposition of tetraethylorthosilicate (TEOS) is then applied on the entire surface of the structure shown in FIG. 1c-1. A cross sectional view of the layer 26 of TEOS applied on the entire structure is shown in FIG. 2a-4. The TEOS 26 can be applied using conventional processes such as CVD or conformal deposition to a thickness of approximately 2000–2500 Å.

The layer of TEOS 26 is then anisotropically etched, by well known techniques, such as Reactive Ion Etch (RIE), until it no longer "covers" the strips of silicon nitride 22. As a result, strips of spacers 26 of TEOS 26 border and are adjacent to each strip of silicon nitride 22. This is shown in FIG. 2b-4. The anisotropic etching of the TEOS 26 continues until the etch stop silicon nitride 22 and the first polysilicon 14 are observed.

Thereafter, the etchant is changed to etch the first polysilicon 14. Anisotropic etching of polysilicon 14 occurs until the first silicon dioxide 12 is observed and is used as the etch stop.

Suitable ion implantation is then made across the entire surface of the structure. Where the ions have sufficient energy to penetrate the first silicon dioxide region 12, they then form a first region 30 in the substrate 10. In all other regions, they are either absorbed into the TEOS 26, the isolation dielectric 20a or 20b, or into the silicon nitride 22, where they have no effect. The result is shown in FIG. 2c-4.

Oxidation of the entire structure shown in FIG. 2c-4 results in the exposed regions of the first polysilicon 14 being oxidized. Thus a layer of silicon dioxide layer 32 of approximately 300 Å is formed. A layer of insulating silicon dioxide is deposited over the entire structure. It should be noted that this "layer " of silicon dioxide 32, is formed in part from regions of TEOS 26 and silicon dioxide 24, and a "layer " 32 is shown for illustration purpose only.

Anisotropic etching of the first layer of insulating material 12, silicon dioxide, is then performed until the substrate 10 is observed with that used as the etched stop. In the process of anisotropically etching the silicon dioxide 12, a portion of the layer 32 will also be etched. A second polysilicon deposition step (of approximately 3000 Å) is performed depositing in the "plug" or "hole" between adjacent strips of the TEOS spacers 26. The polysilicon material is removed from the silicon nitride 22 by a method of topographical selectivity. The preferred method is chem-mechanical polishing (CMP). The second polysilicon 34 forms ohmic contact with the first region 30 in the substrate 10. Polysilicon 34 may be doped and used as a diffusion source to supplement or replace the impurities forming the region 30. Polysilicon 34 may also be replaced by any suitable conductor such as tungsten, tungsten silicide, etc. The result is the structure shown in FIG. 2d-4. The structure is then oxidized forming a thin layer of silicon dioxide 36 on the second polysilicon plug 34.

The silicon nitride 22 is then etched until the first polysilicon 14 is reached as the etch stop. Thereafter, the first polysilicon 14 is anisotropically etched until the first silicon dioxide 12 is reached as the etch stop. The formation of the "cap" 36 on the second polysilicon 34 prevents the second polysilicon 34 from being etched during this process. This is shown in FIG. 2e-4.

A thin layer of silicon dioxide 38 is then formed over the entire structure. The layer 36 is approximately 160–170 Å in thickness and can be formed by a combination of thermal oxidation and deposition. This is shown in FIG. 2f-4.

A third layer of polysilicon 40 is then deposited over the entire structure to a thickness of approximately 2000 Å. This shown in FIG. 2g-4. The third layer of polysilicon 40 can be deposited by LPCVD.

The third layer of polysilicon 40 is then anisotropically etched. The resulting structure is a plurality of spacers 40 in the row or X direction, parallel to the plug 34 in the row or X direction. The third layer of polysilicon 40 is etched until it "clears" the silicon dioxide 38 on "top" of the plug 34. Thus, the polysilicon spacers 40 to either side of the "plug " 34 are not connected to one another. The result is the structure shown in FIG. 2h-4.

The spacers 40 are then oxidized to form a layer of silicon dioxide 42 covering all the exposed areas of the third polysilicon spacer 40. Ion implantation can be made at this point or prior to this oxidation step to form the second regions 70. The silicon dioxide 38 between adjacent polysilicon spacers 40 is then anisotropically etched until the substrate 10 is exposed with that used as the etch stop. A conventional contact 44 to metal 46 connection with a deposited dielectric 48 is formed to connect the second regions 70 to a common bit line 46. The dielectric 48 may also be silicon dioxide, the same material as the layer 42. The resulting structure is shown in FIG. 2I-4.

Figures 2, 2A, 3, 4:
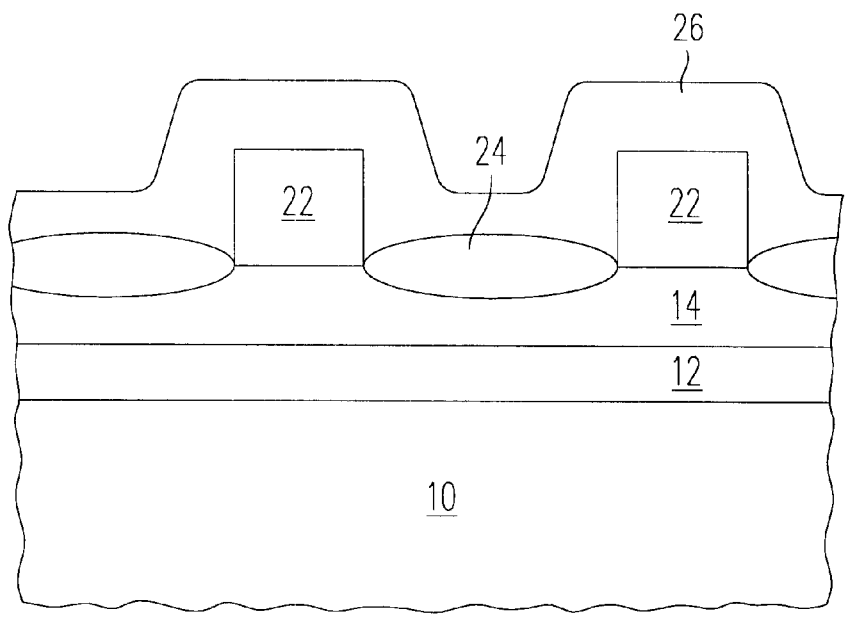
Figures 2, 2B, 3, 4:
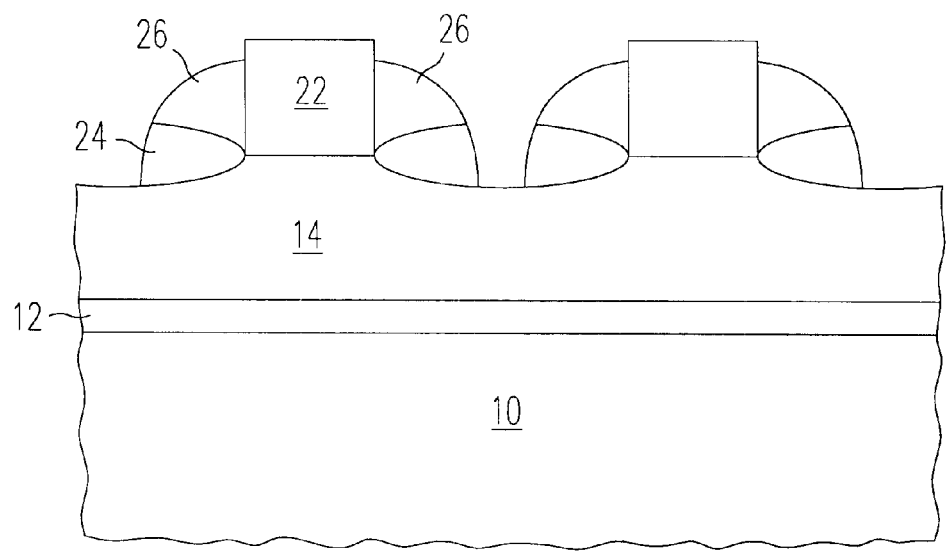
Figures 2, 2C, 3, 4:
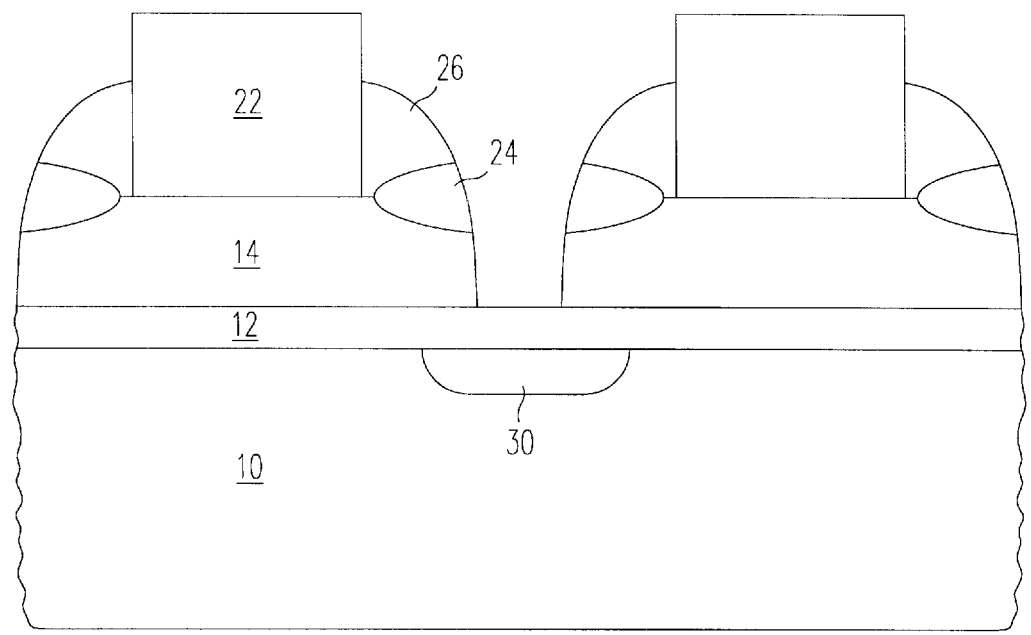
Figures 2, 2D, 3, 4:
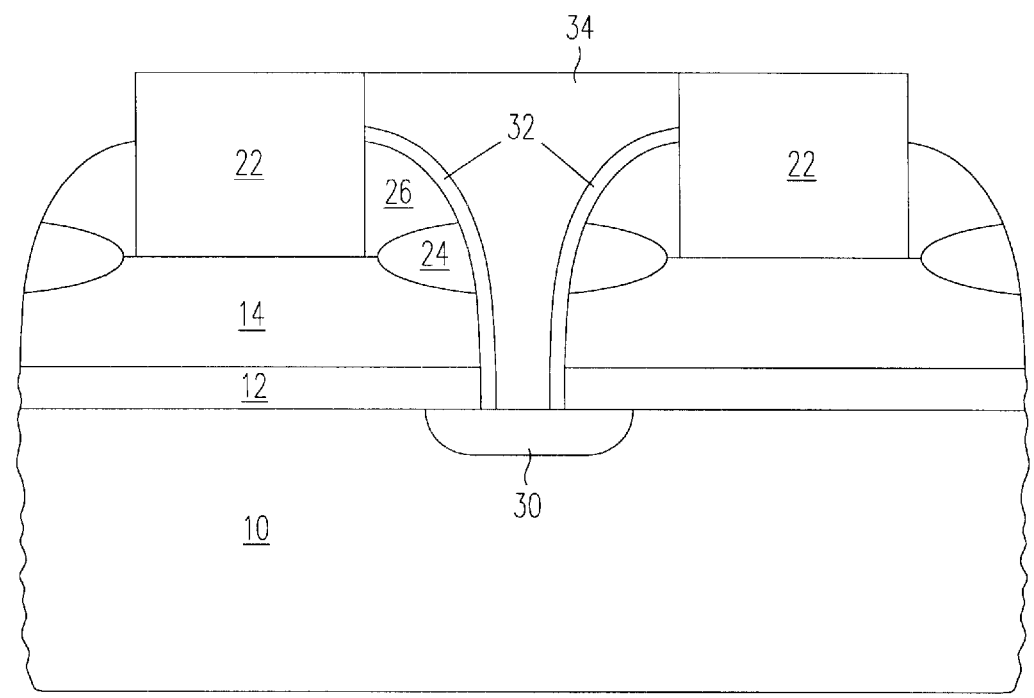
Figures 2, 2E, 3, 4:
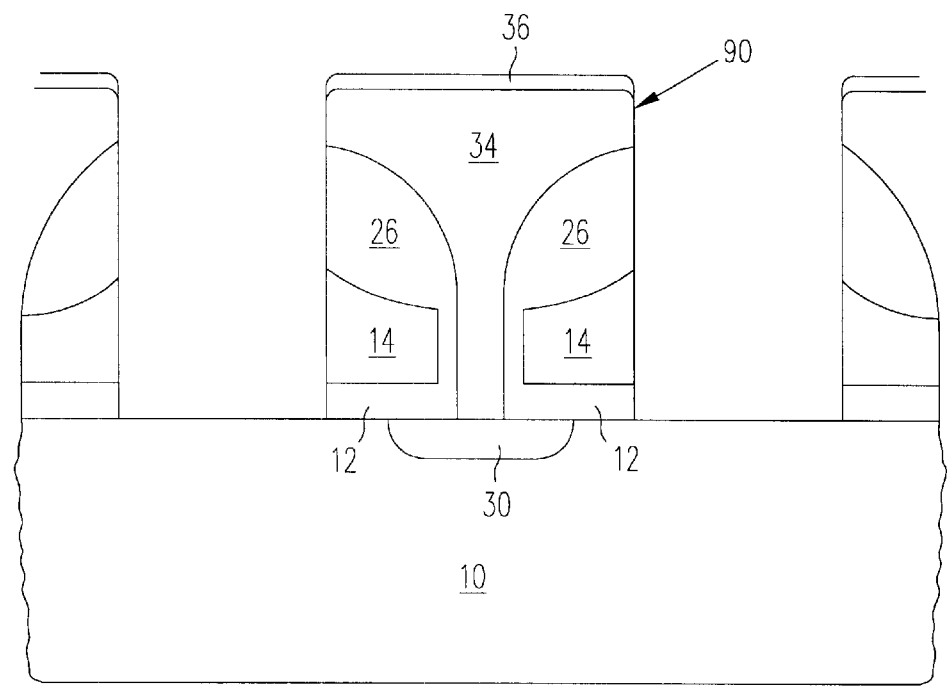
Figures 2, 2F, 3, 4:
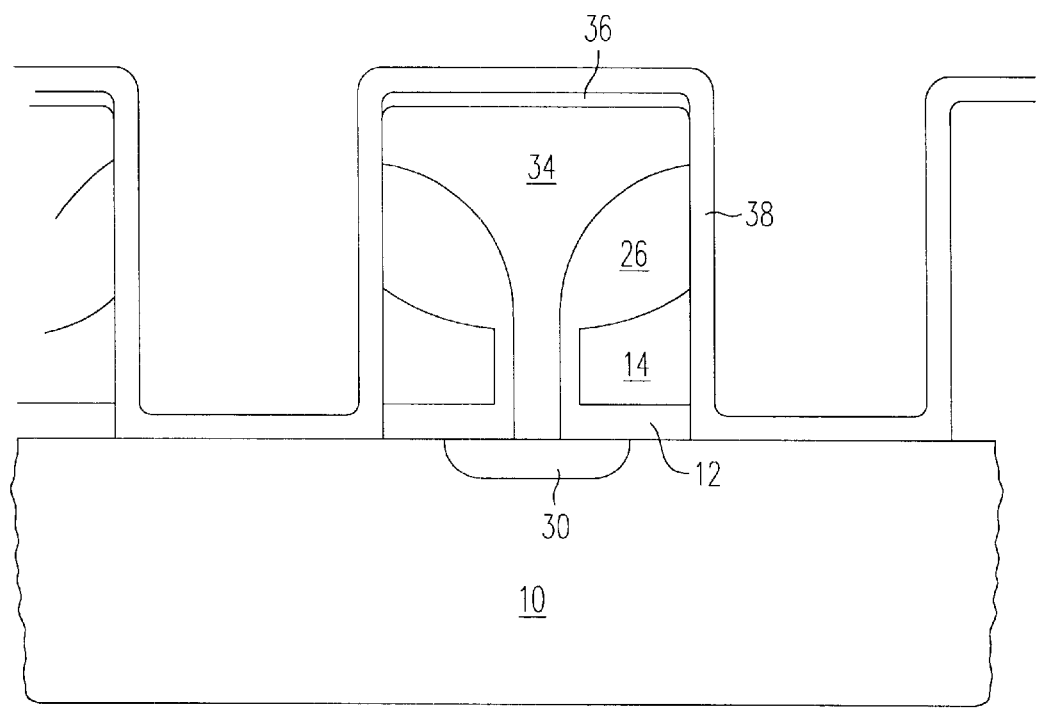
Figures 2, 2G, 3, 4:
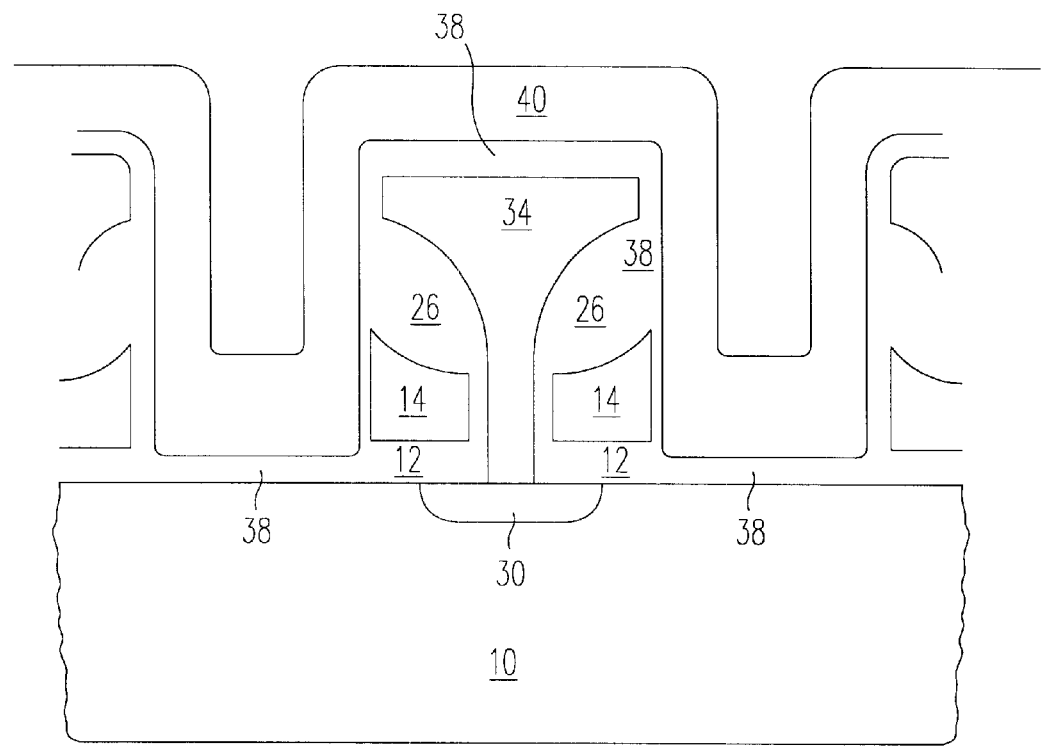
Figures 2, 2H, 3, 4:
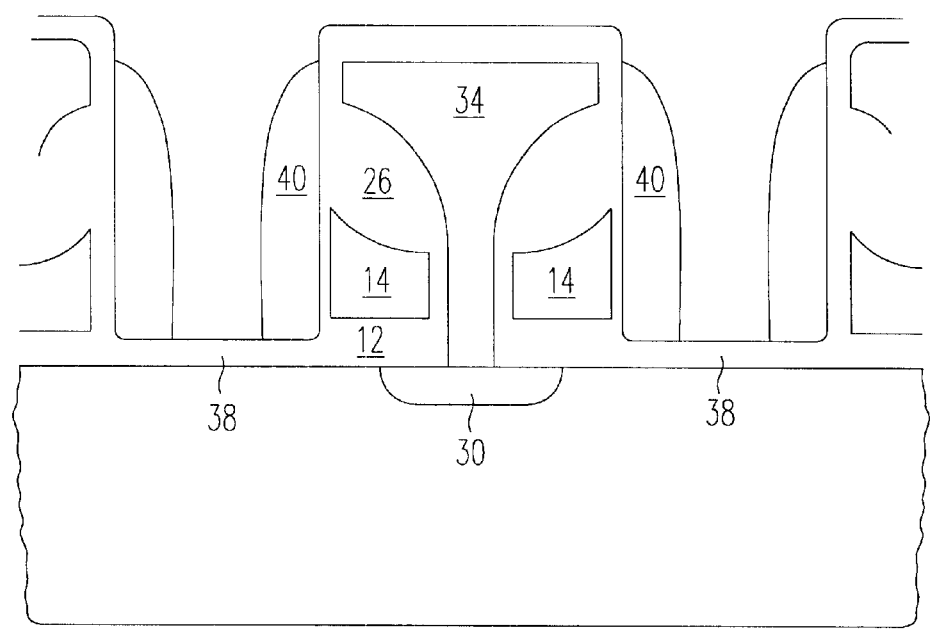
Figures 2, 2I, 3, 4:
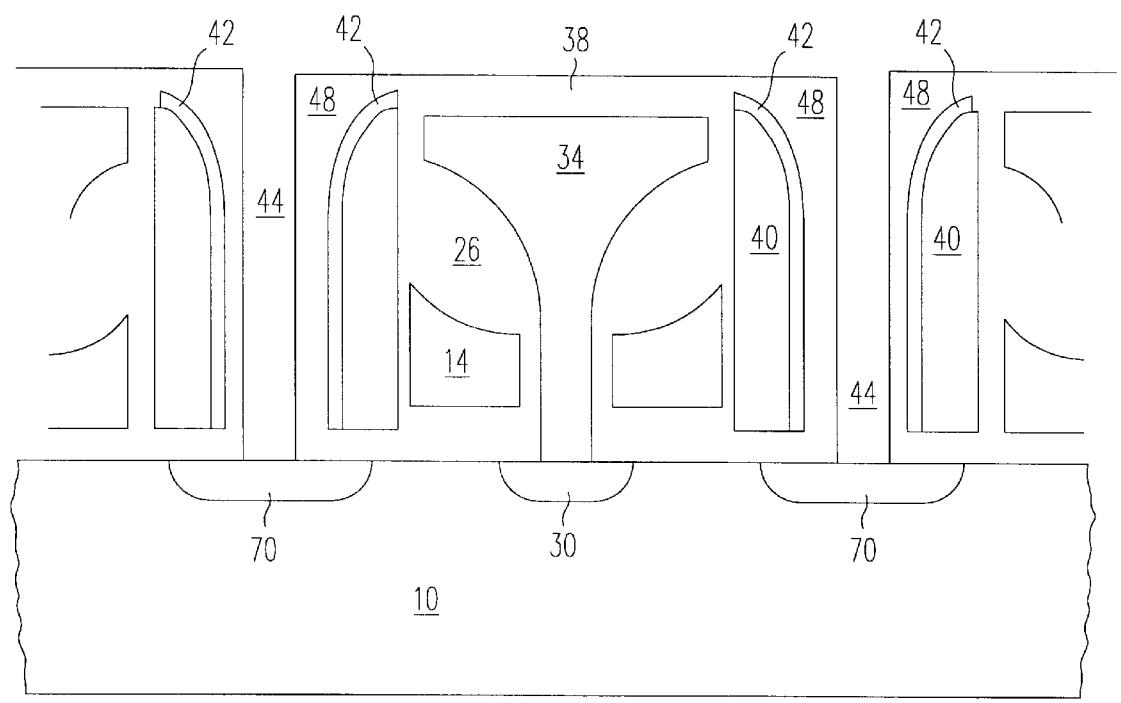
Figures 1, 2J:
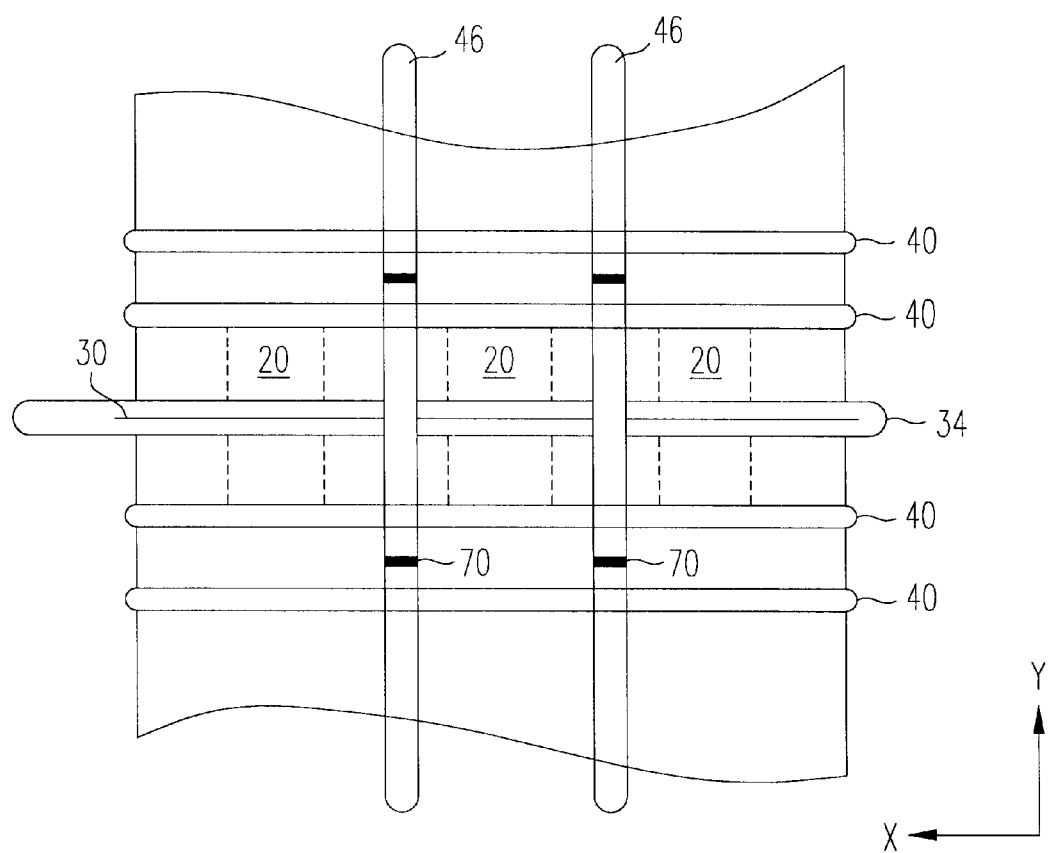

Referring to FIG. 2J-1, there is shown a top plan view of the resulting structure and the interconnection of the bit lines 44 to the second regions 70 and of the control lines 40 which run in the X or the row direction and finally the source lines 34 which connect to the first regions 30 within the substrate 10. Although the source lines 34 (as should be understood by those skilled in the art, the word "source" is interchangeable with the word "drain".) makes contact with the substrate 10 in the entire row direction, i.e. contact with the active regions as well as the isolation regions, the source line 34 electrically connects only to the first regions 30 in the substrate 10. In addition, each first region 30 to which the "source" line 34 is connected is shared between two adjacent memory cells. Similarly, each second region 70 to which the bit line 44 is connected is shared between adjacent memory cells.

The result is a plurality of non volatile memory cells of the split gate type having a floating gate 14, a control gate 40 which is a spacer which runs along the length of the row direction connecting to the control gates of other memory cells in the same row, a source line 34 which also runs along the row direction, connecting pairs of the first terminal 30 of the memory cells in the same row direction, and a bit line 44 which runs along the column or Y direction, connecting pairs of the second terminal 70 of the memory cells in the same column direction, The formation of the control gate, the floating gate, the source line, and the bit line, are all self-aligned. The non-volatile memory cell is of the split gate type having floating gate to control gate tunnelling all as described in U.S. Pat. No. 5,572,054, whose disclosure is incorporated herein by reference with regard to the operation of such a non-volatile memory cell and an array formed thereby.

Figure 8:
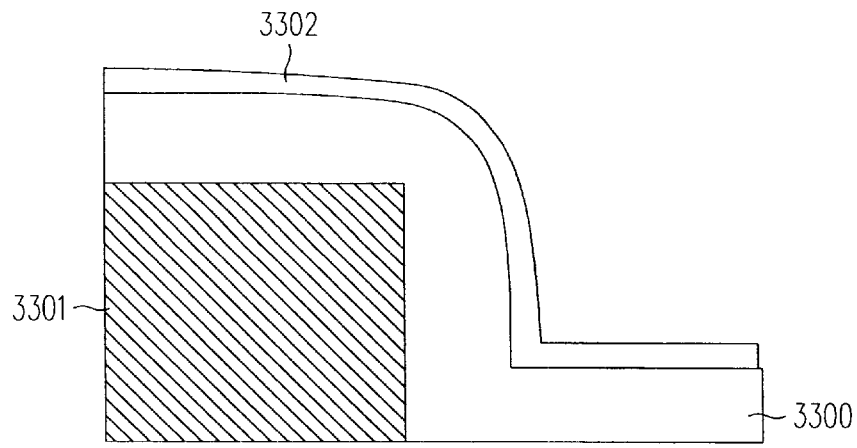
FIG. 8 is a cross sectional view of a drawing of the polysilicon/oxide stacking for the formation of a square spacer.
Figure 9:
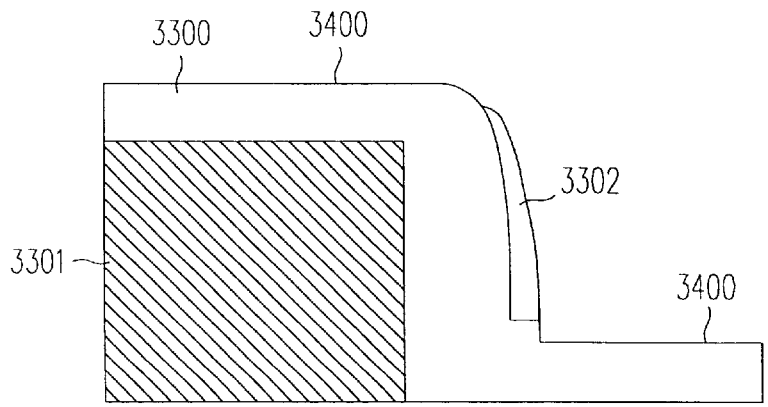
FIG. 9 is a cross sectional view of the etch breaking through the oxide on planar surfaces and forming an oxide spacer on the sidewall.
Figure 10:
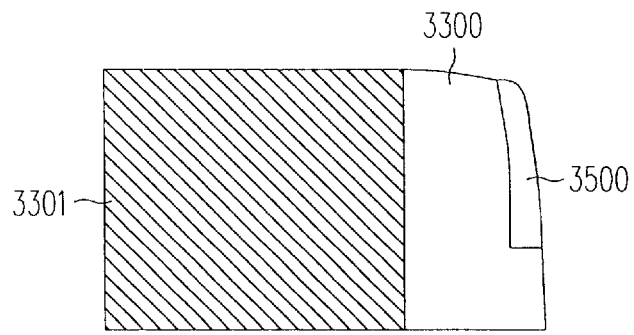
FIG. 10 is a cross sectional view of the oxide spacer slowing the polysilicon etch at the corner producing a square spacer.

A variation of the processing of the polysilicon 40 in FIGS. 2g-4 to 2h-4 is as follows. When the polysilicon 40 is etched, the resulting spacers may have a rounded appearance. It is beneficial that these spacers are more of a square shape. FIG. 8 shows one embodiment of how to make polysilicon spacers with uniform dimensions. A polysilicon film 3300 (preferably 200 nm) intended to form the spacer may be conformally deposited over a mandrel 3301 which could be another gate of a sacrificial film. An oxide film 3302, preferably 20–40 nm, may then be conformally deposited over the polysilicon film 3300. An anisotropic etch chemistry may then be used, as shown in FIG. 9, to remove the oxide film 3302 from the planar top surface 3400 and then to begin to remove the polysilicon film 3300. The etch rate ratio of this etch is such that oxide 3302 on the planar surface 3400 is removed more slowly than polysilicon 3300. Because the etch rate of any film using RIE processing is enhanced at exposed corners, the spacer 3500 projects from the corner of the polysilicon 3300 from the enhanced etch rate and preserves the vertical polysilicon 3300 etch profile as shown in FIG. 10. Accordingly, this processing shown in FIGS. 8-10 may be used to form square wordline spacers 12.

Figure 11:
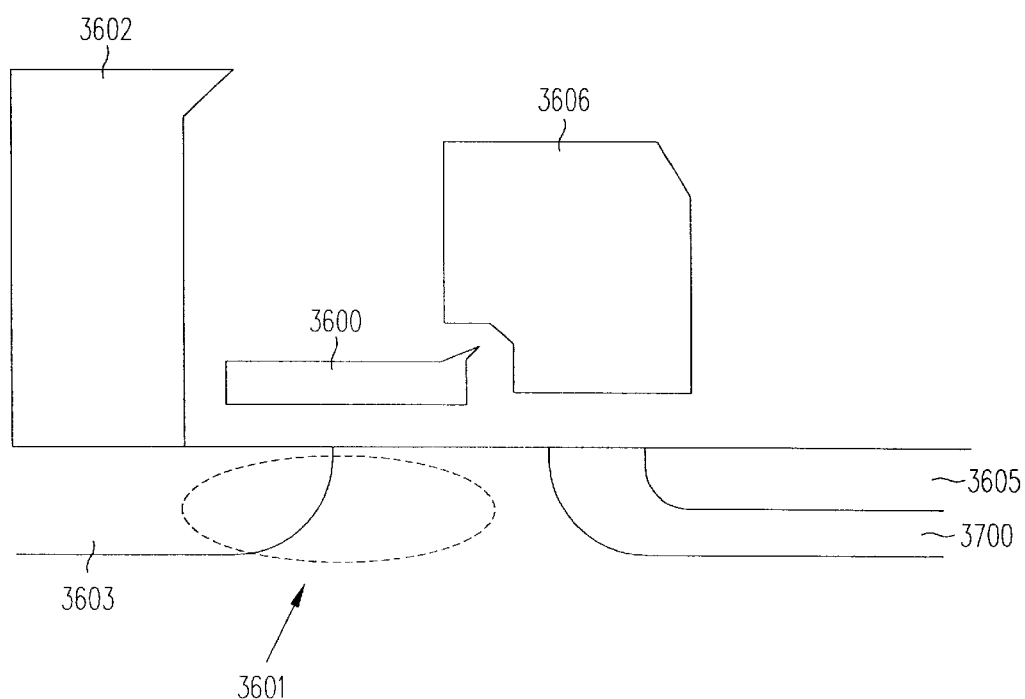
FIG. 11 is a schematic drawing of a single well split gate non-volatile memory cell made by the method of the present invention having a halo.

The following discussion relates to the doping of the well regions in the silicon substrate 10, as shown in FIG. 11. This discussion more particularly relates to implanting the first region 30 in the substrate 10. A floating gate 3600 (along with its mirror floating gate, as discussed above) may be patterned and formed. A floating gate well 3601 is formed by subsequently implanting through the floating gate 3600. The floating gate 3600 of the cell and its mirror cell may be separated by etching through the floating gate 3600 down to the substrate 10. A first terminal region 3603 may then be implanted into the floating gate hole in a conventional manner. Polysilicon 3602 may then be deposited into the floating gate hole (plug to the first terminal 30) to form a floating gate injector point. A screen oxide may be grown on the injector tip and over the wordline channel. The wordline spacer 3606 may be subsequently deposited and etched. The bitline junction 3605 and a bit line halo 3700 may then be implanted. The halo 3700 is preferably formed by implanting at an angle such that it forms under the wordline spacer 3606 and immediately next to the bitline/second terminal region 3605.

The single well method of forming the foregoing described memory cell is advantageous because it reduces the process cost and complexity by eliminating the memory well mask, enhancing cell reliability by avoiding the need to implant into the injector tip insulator and subjecting the tip insulator to the application and removal of photoresist, and improves the manufacturability of the cell by reducing the sensitivity of the cell electrical characteristics to variations in the cell dimensions.

Referring to FIG. 3 there is shown a cross-sectional view similar to the cross sectional view shown in FIG. 1c-4. After the silicon nitride strips 22 are formed in the row direction, and the silicon dioxide 24 removed, the polysilicon 14 can then be isotropically etched to create an undercut 50. As shown in FIG. 2i-4, and as described in the aforementioned U.S. Patent, it is desirable to have a sharp tip formed in the floating gate 14 in order to enhance the poly-to-poly tunnelling effect. The formation of the undercut 50, as shown in FIG. 3, through isotropic etching of the polysilicon 14 enhances the formation of the sharp tip in the eventually formed floating gate 14.

Figures 1, 4A:
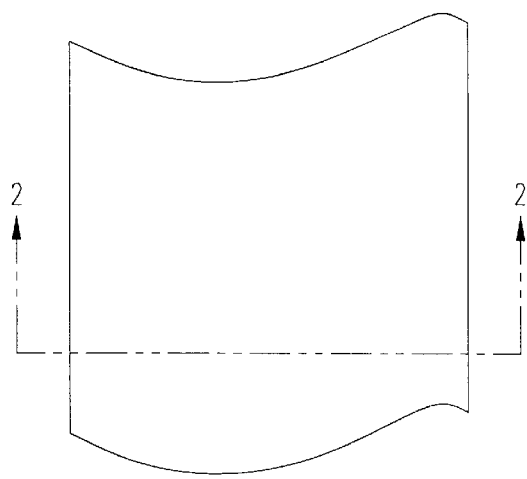
Figures 2, 4A:
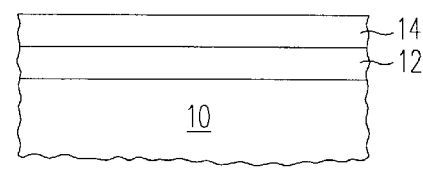
Figures 1, 4B:
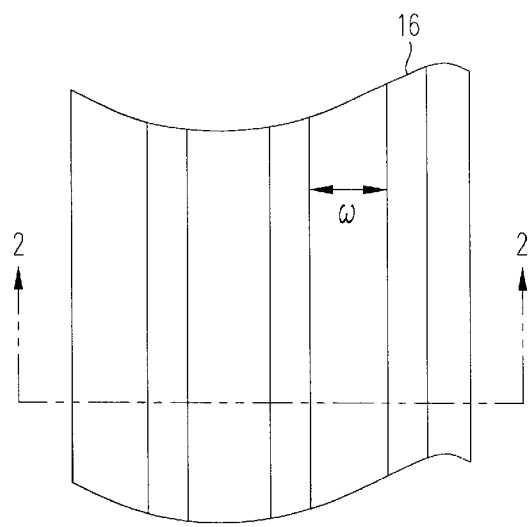
Figures 2, 4B:
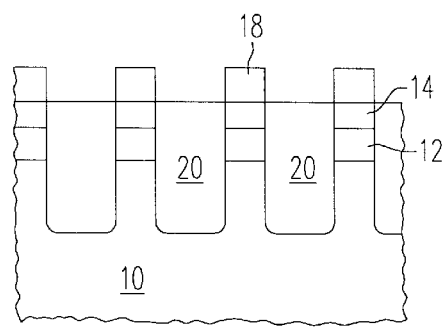

Referring to FIG. 4a-1, there is shown a top plan view of the first step of another embodiment of the method of the present invention. The steps shown in FIGS. 4a-1, 4a-2, 4b-1, 4b-2 are identical to those described for the process shown in FIGS. 1a-1, 1a-2, 1b-1 and 1b-2. Similar to the foregoing description with regard to the formation of the isolation regions 20, it is assumed that the isolation regions 20 are of the shallow trench type and the trench is planar with respect to the first polysilicon 14.

Thus, alternating stripes of active regions and isolation regions 20 of shallow trench are formed in the substrate 10. A second insulating layer 13 is then formed on the entire surface of the structure shown in FIG. 4b-1. This insulating layer may be formed by thermal oxidation of the first polysilicon 14, or deposition by CVD, or a combination of these processes. It is also common in the current state of the art to form this insulator as a composite of silicon dioxide/silicon nitride/silicon dioxide (ONO). A second layer of polysilicon 15 is then deposited on the second layer of silicon dioxide or ONO 13. The second layer of polysilicon 15 is formed by deposition (for example CVD) resulting in the second layer of silicon dioxide 13 being of about 100 Å in thickness, and the second layer of polysilicon 15 being of about 100 Å in thickness.

Thereafter, strips of silicon nitride 22 are formed in the row or X direction on the polysilicon 15. The formation of strips of silicon nitride 22 on the polysilicon 15 is identical to the process of the formation of the silicon nitride 22 on the first polysilicon 14 as described and shown in FIG. 1c-1, 1c-3 and 1c-4. Each strip of silicon nitride 22 cross over an active region and over an isolation region of shallow trench 20, in the substrate 10. The result is shown in FIG. 4c-1, 4c-3, and 4c-4.

Figures 1, 4C:
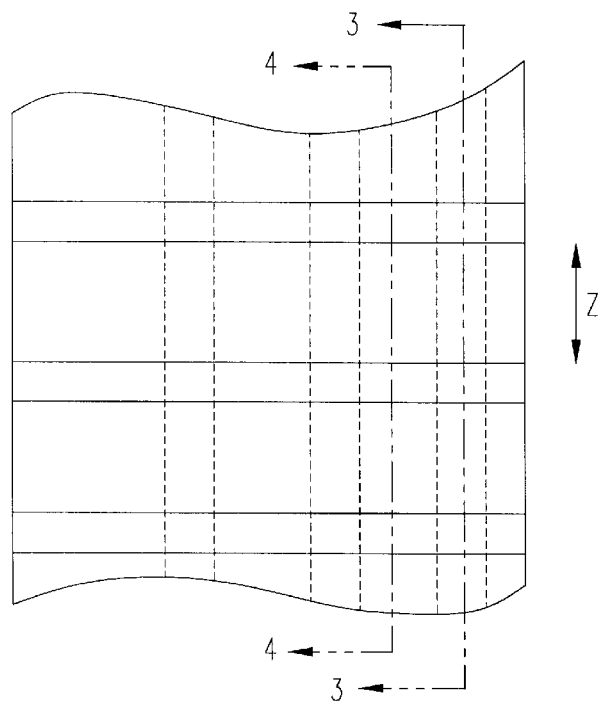
Figures 4, 4C:
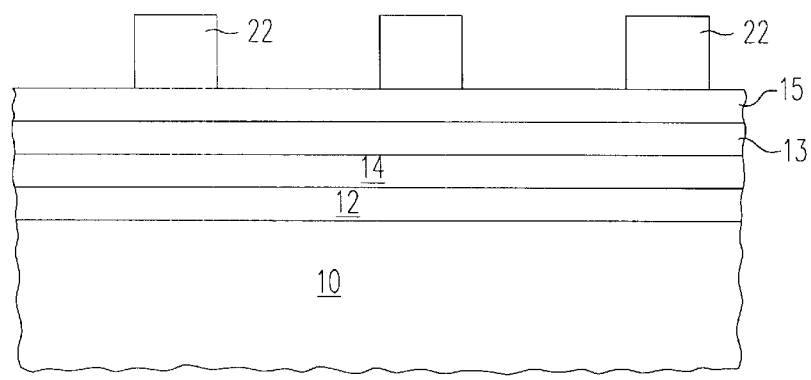
Figures 3, 4C:
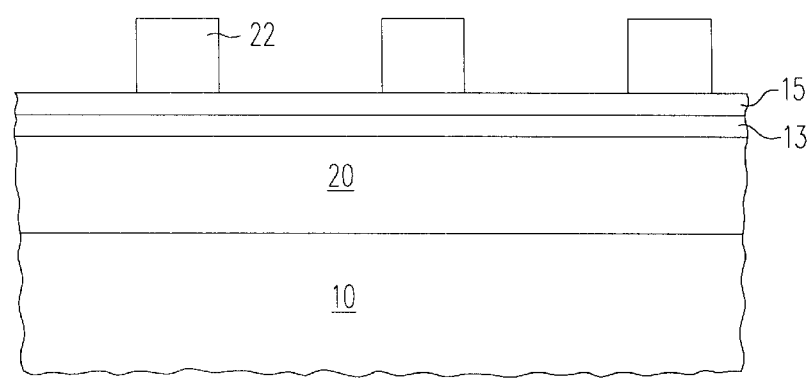

Similar to the foregoing discussion with regard to the formation of the structure shown in FIG. 1 using a non self-aligned method, the structure shown in FIG. 4c can be formed by a non self-aligned method.

Figures 4, 5A:
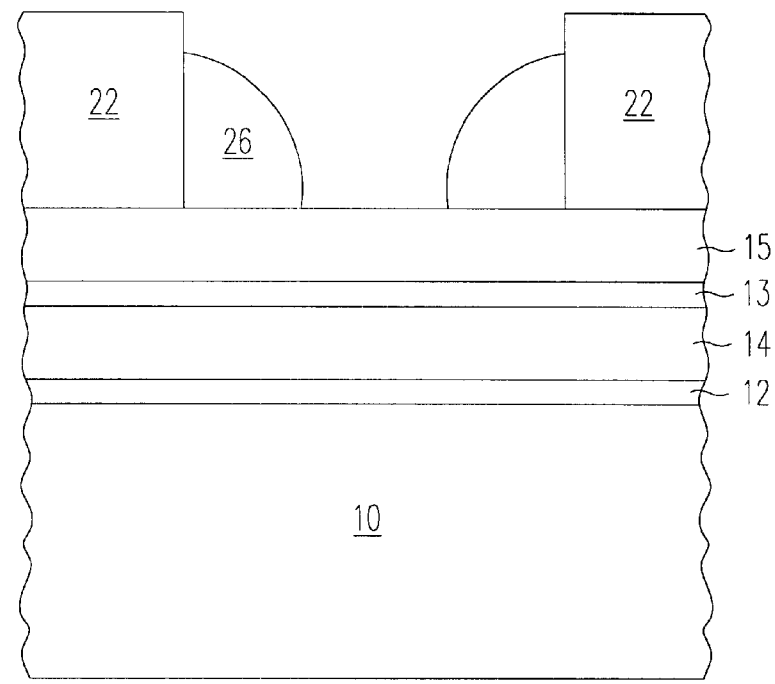

Thereafter, similar to the process described for the structure shown in FIG. 2a-4, another layer of silicon dioxide 26 is then deposited everywhere. The silicon dioxide 26 is then anisotropically etched until it "clears" the top of each of the silicon nitride strips 22. The result is shown in FIG. 5a-4. The silicon dioxide 26 is a spacer formed in the row direction and is immediately adjacent and contiguous to each strip of silicon nitride 22. Alternating steps of anisotropic etching are performed. First, anisotropic etching of second layer of polysilicon 15 is performed, until it reaches the second silicon dioxide 13, which is used as the etch stop. Thereafter, anisotropic etching of the second layer of silicon dioxide 13 occurs until it reaches the first polysilicon layer 14 which is used as an etch stop. Anisotropic etching of first layer of polysilicon 14 is performed, until it reaches the first silicon dioxide 12, which is used as the etch stop. Ion implantation into the substrate 10 is then performed forming the first region 30 in the substrate 10. Of course, ion implantation into the substrate 10 need not occur after the etching of the second polysilicon 15, second silicon dioxide 13, and the first polysilicon 14. Ion implantation can occur after any of those etch steps.

Figures 4, 5B:
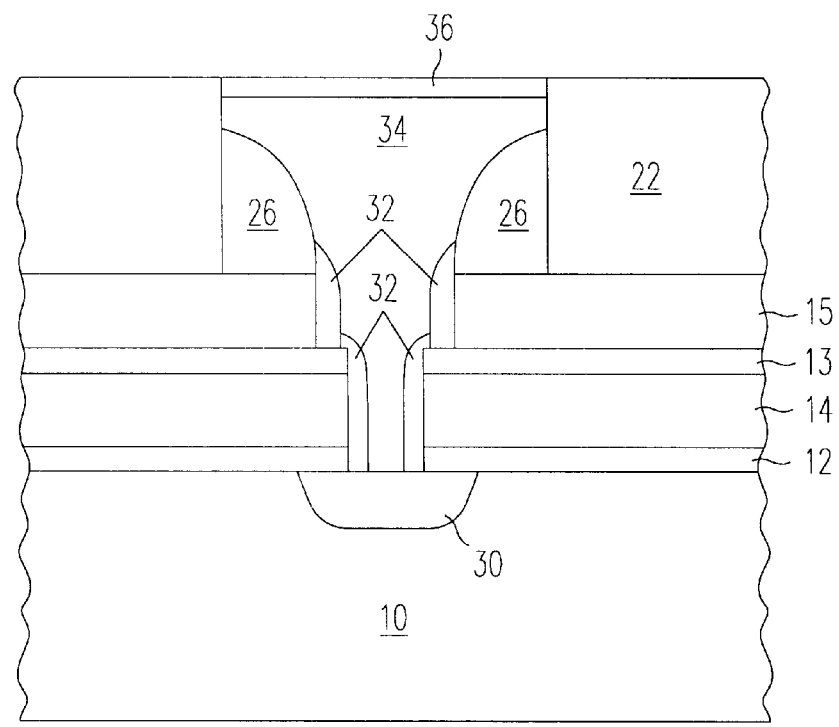

An insulator 32 is deposited over the entire structure. The insulator 32 may be silicon dioxide, silicon nitride or any other dielectric. One example is silicon dioxide which is formed as a result of direct oxidation of the second polysilicon 15 and the first polysilicon 14. The exposed silicon dioxides 32 are anisotropically etched by RIE to expose the first region 30 while maintaining the insulation around the polysilicon 14 and polysilicon 15. A third polysilicon 34 is deposited over the entire structure. It is removed with a topographically selective process such as CMP. This procedure is the same as that used in the description of FIG. 2d-4. The third silicon 34 forms an ohmic contact to the first region 30 in the substrate 10. The "top" of the polysilicon 34 is oxidized to form a silicon dioxide 36 cap. The result is the structure shown in FIG. 5b-4.

Figures 4, 5C:
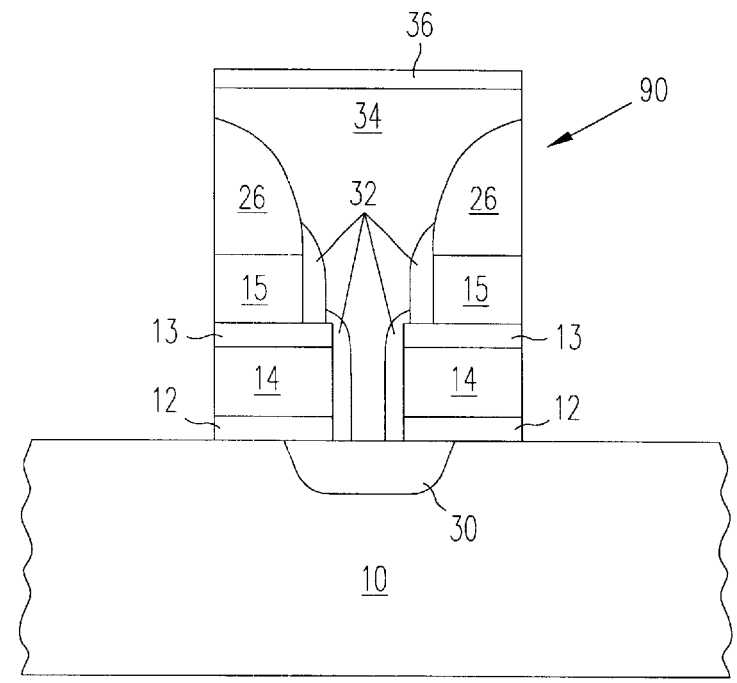
Figures 4, 5D:
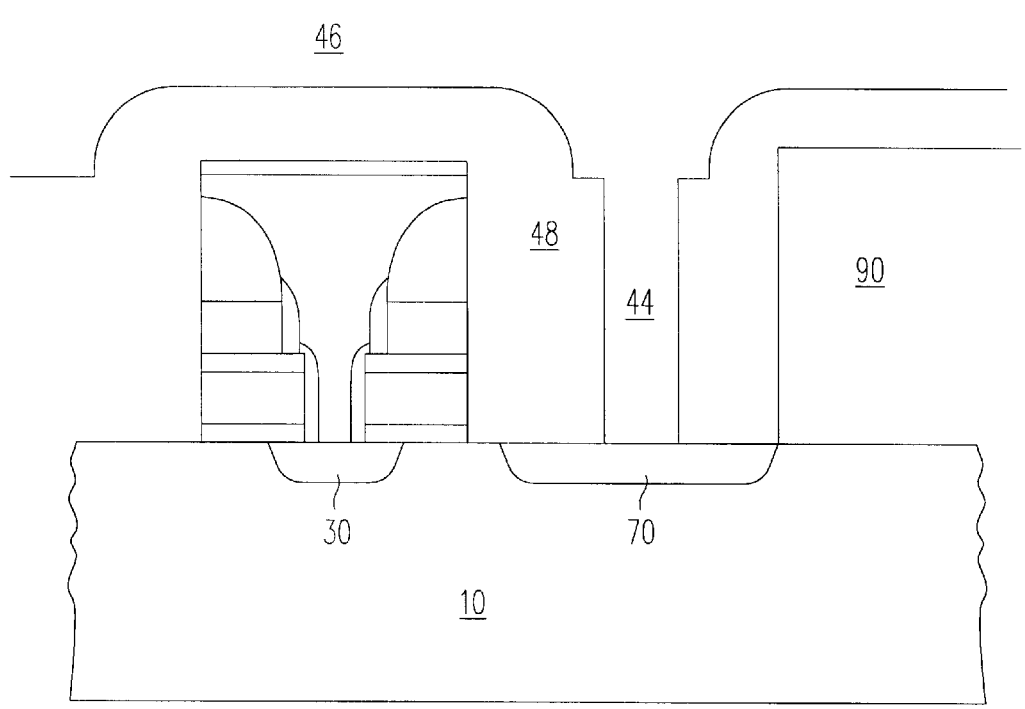

The silicon nitride 22 is then etched reaching the second polysilicon 15 as the etch stop. The second polysilicon 15 is then anisotropically etched reaching the second silicon dioxide 13 as the etch stop. The second silicon dioxide 13 is anisotropically etched reaching the first polysilicon 14 as the etch stop. The first polysilicon 14 is anisotropically etched reaching the first silicon dioxide 12 as the etch stop. The first silicon dioxide 12 is anisotropically etched reaching the substrate 10. The result is the structure shown FIG. 5c-4. Thereafter, the second region 70 and bit line 46 connection to the second region 70 are formed in a conventional process. A typical sequence would involve dielectric 48 deposition followed by lithographic contact hole definition and etch followed by metal deposition and patterning, all as shown in FIG. 5d-4.

Figures 4, 6A:
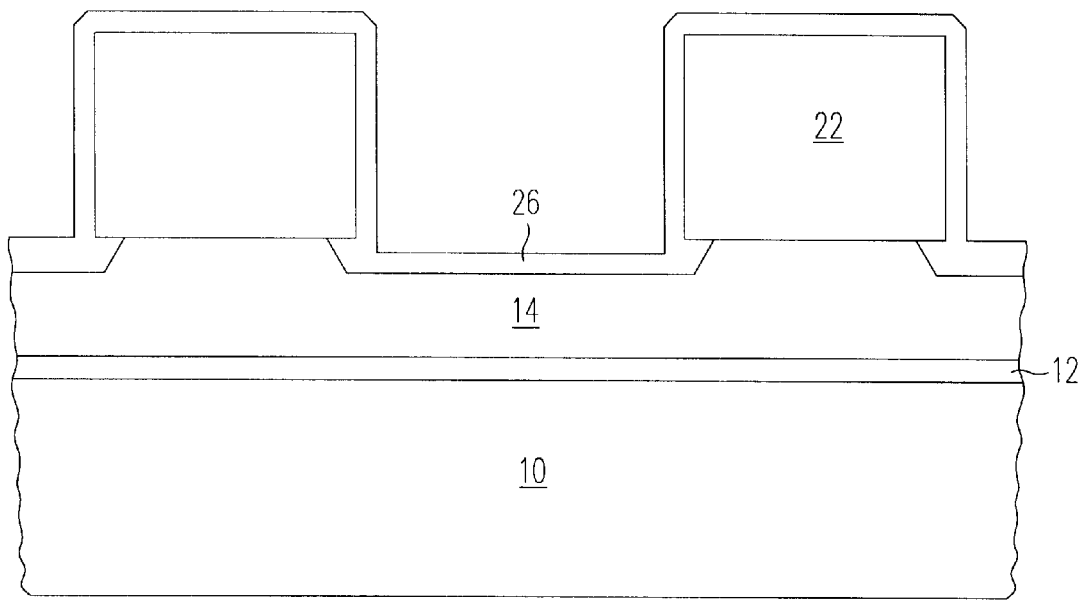

In yet another embodiment of the method of the present invention, the method begins with the process steps shown and described for the formation of the structure shown in FIGS. 1a-1, 1a-2, 1b-1, and 1b-2. After the first silicon dioxide layer 12 and first polysilicon layer 14 are formed and the isolation regions and grooves 16 are formed by the masking step, and the isolation regions of shallow trench are formed, strips of silicon nitride 22 in the row direction are then formed. Further, as described in FIG. 3, undercutting of the first polysilicon layer 14 under the silicon nitride strip 22 can be made so as to form the undercut region 50. Thereafter, a thin layer of silicon dioxide or ONO 26, on the order of 120 Å thickness formed by oxidation and LPCVD process is then deposited over the entire structure. This is shown in FIG. 6a-4.

Figures 4, 6B:
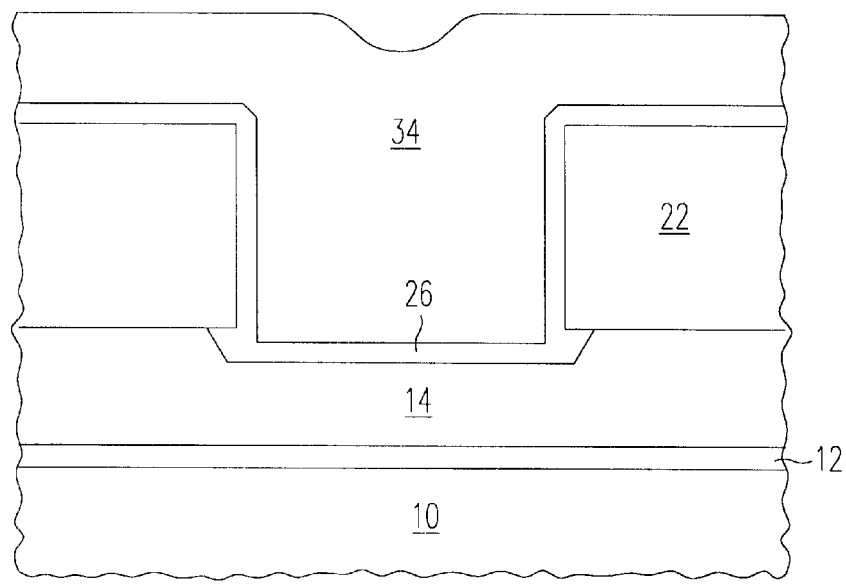

Polysilicon 34 is then deposited everywhere. This can be done by LPCVD. The result is shown in FIG. 6b-4.

Figures 4, 6C:
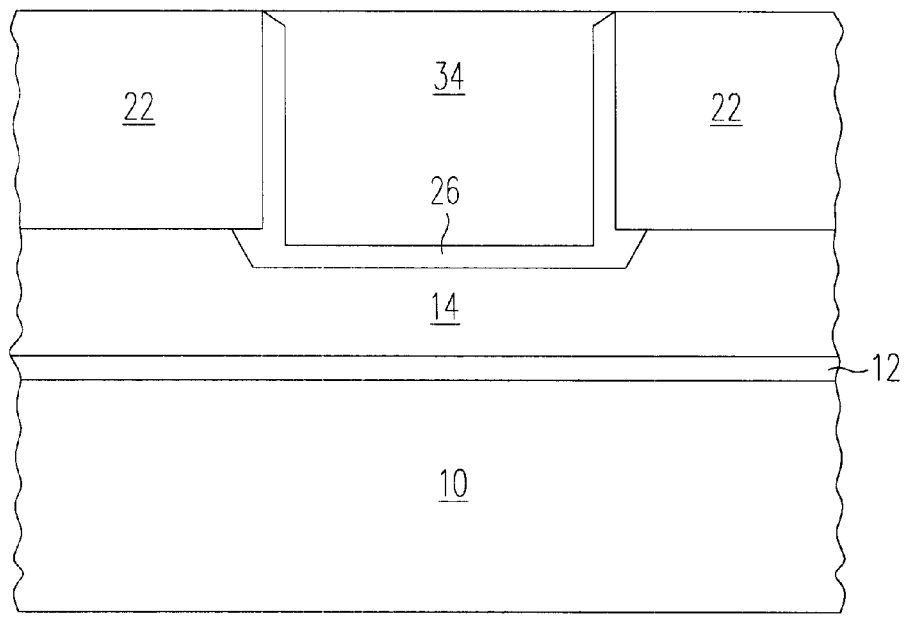

Polysilicon 34 is then selectively etched by a planarizing process such as CMP using silicon nitride 22 as the etch stop. The result is the removal of all polysilicon 34 and silicon dioxide 26 from the "top" of the silicon nitride 22. The resulting structure is shown in FIG. 6c-4.

Figures 4, 6D:
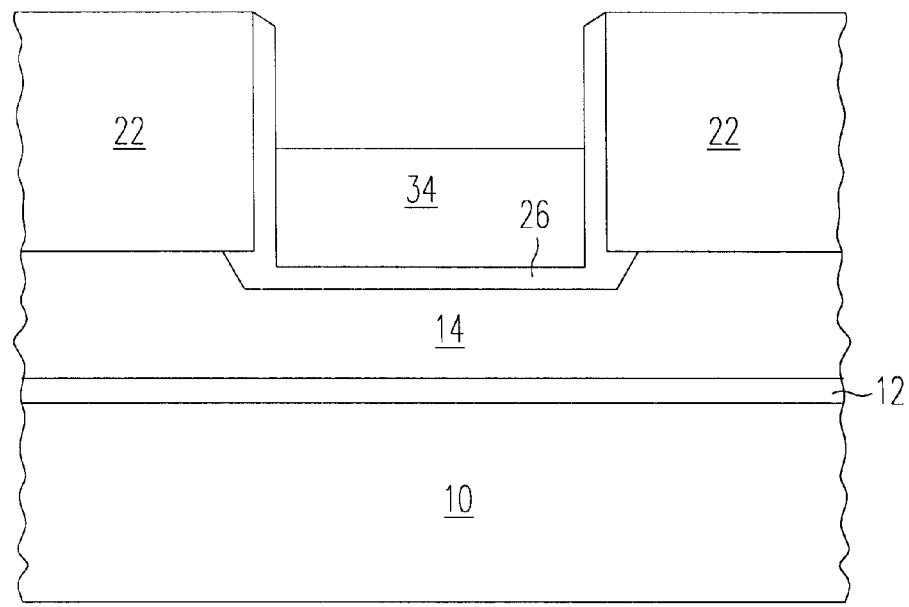

Thereafter, the polysilicon 34 is etched at a controlled rate for a predetermined period of time such that a layer of polysilicon 34, of approximately 500 Å thickness remains in the region between adjacent strips of silicon nitride 22. The etch may be anisotropic (RIE) or isotropic. The result is the structure shown in FIG. 6d-4.

Figures 4, 6E:
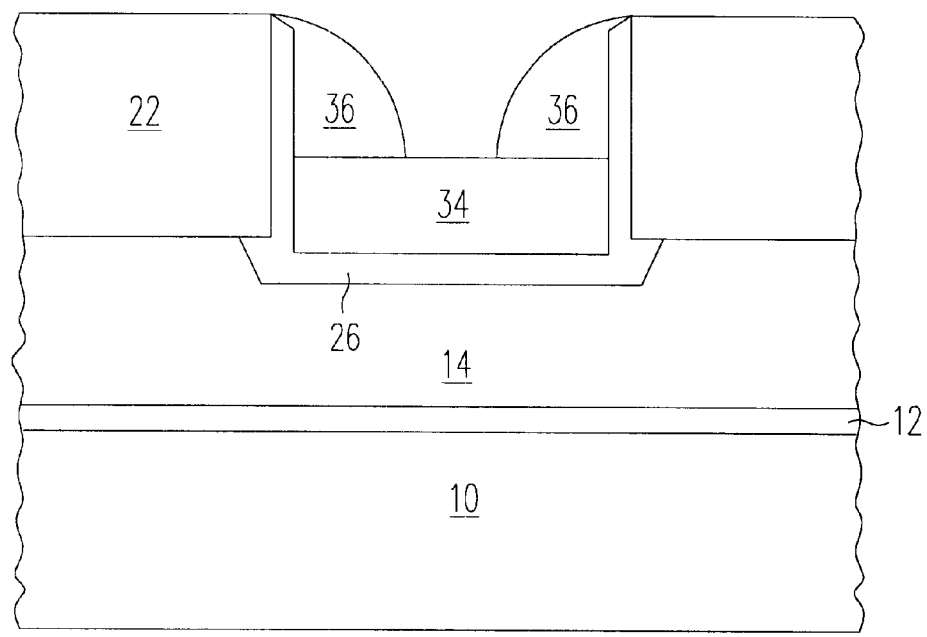

Silicon dioxide 36 is then deposited over the entire structure. It is then anisotropically etched and this results in the formation of spacers which are continuous in the row direction and immediately adjacent to the silicon dioxide 26 which is adjacent to the silicon nitride 22. The result is shown in FIG. 6e-4.

Figures 4, 6F:
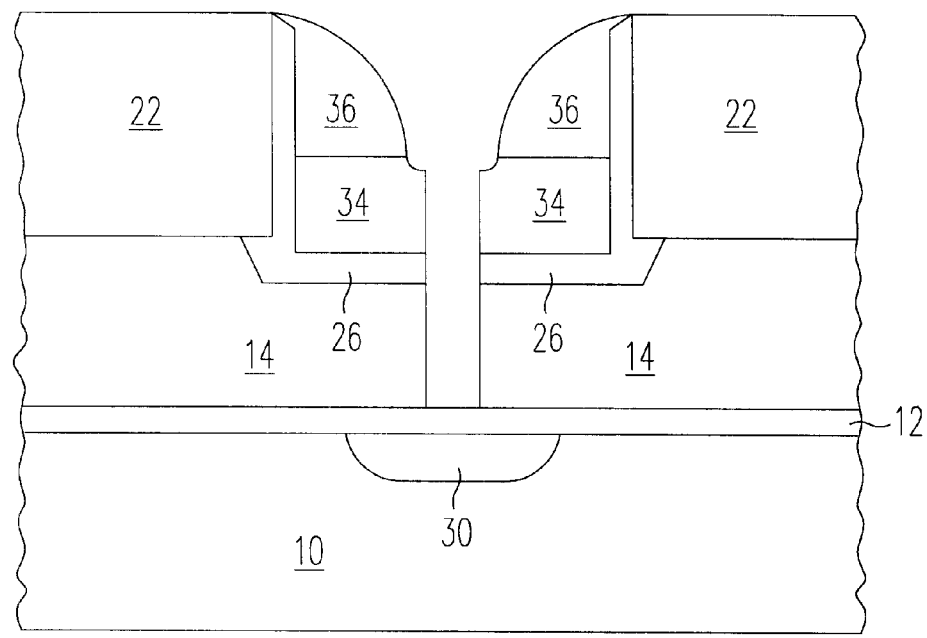
Figures 4, 6G:
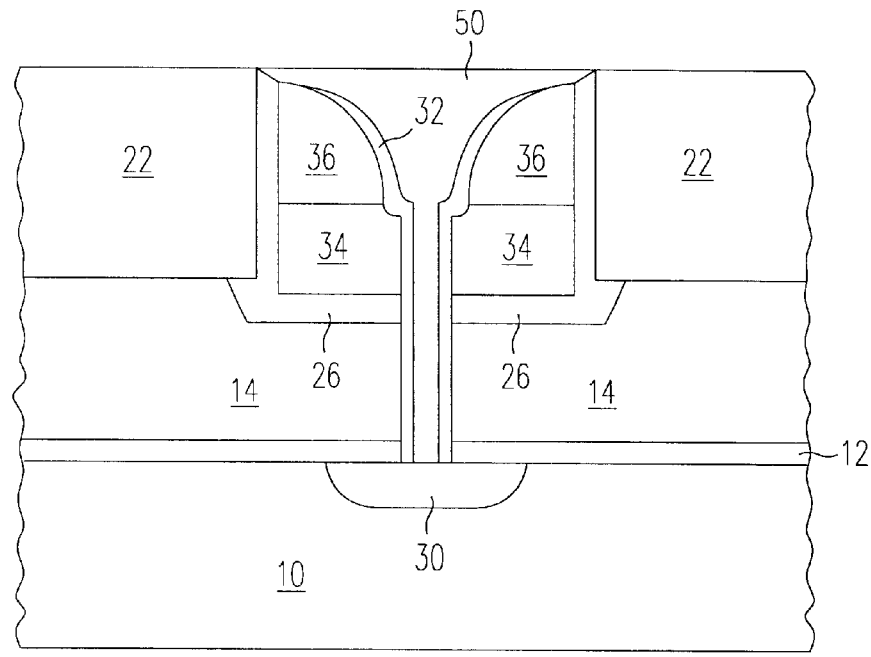

Because the silicon dioxide spacers 36 are spaced apart, the polysilicon 34 is exposed and can be anisotropically etched. The polysilicon 34 is anisotropically etched until the silicon dioxide 26 is reached and is used as the etch stop. Silicon dioxide 26 is anisotropically etched (this etch also etches away some of the silicon dioxide 36), until the first polysilicon 14 is reached and is used as the etch stop. The first polysilicon 14 is then anisotropically etched (this also results in etching of some of the polysilicon 34), until the first silicon dioxide 12 which is used as an etch stop is reached. Ions are then implanted through the first silicon dioxide 12 to form the first region 30 in the substrate 10. The result is shown in FIG. 6f-4. Similar to the discussion heretofore, the step of ion implantation to form the first region 30 can be made prior to the etching of the first polysilicon 14 or even prior to the etching of the silicon dioxide 26. Silicon dioxide is then formed everywhere and in particular covering the polysilicon 34 and the first polysilicon 14. This can be accomplished by CVD. The first silicon dioxide 12 is anisotropically etched. A source line 50 comprised of polysilicon fills in the region between the adjacent strips of silicon dioxide spacers 36, and the silicon nitride 22 and forms an ohmic contact with the first region 30 in the substrate 10. The result is shown in FIG. 6g-4.

Figures 4, 6H:
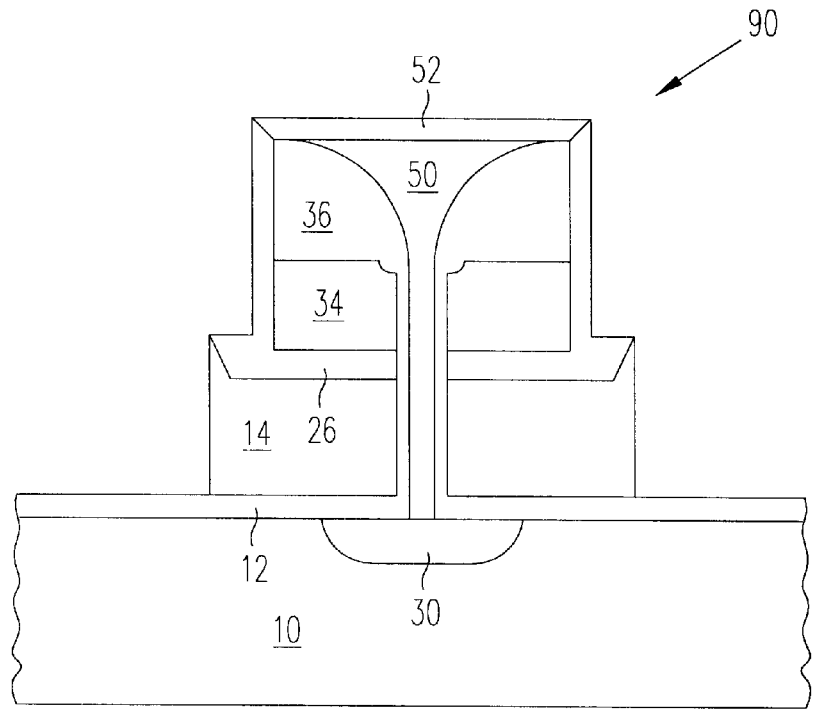

Silicon nitride 22 is then etched until the first polysilicon 14 is reached which is used as an etch stop. The first polysilicon 14 is then anisotropically etched until the first silicon dioxide 12 is reached and is used as an etch stop. The silicon dioxide 12 may optimally be anisotropically etched until the substrate 30 is reached with the substrate 10 being used as an etch stop. The result is the structure shown in FIG. 6h-4.

Thereafter, the formation of the control gate spacer 40 and of the second region 70 are all as shown and described above for FIGS. 2f-4–2i-4. The result is the structure shown in FIG. 6i-4.

Figures 4, 6I:
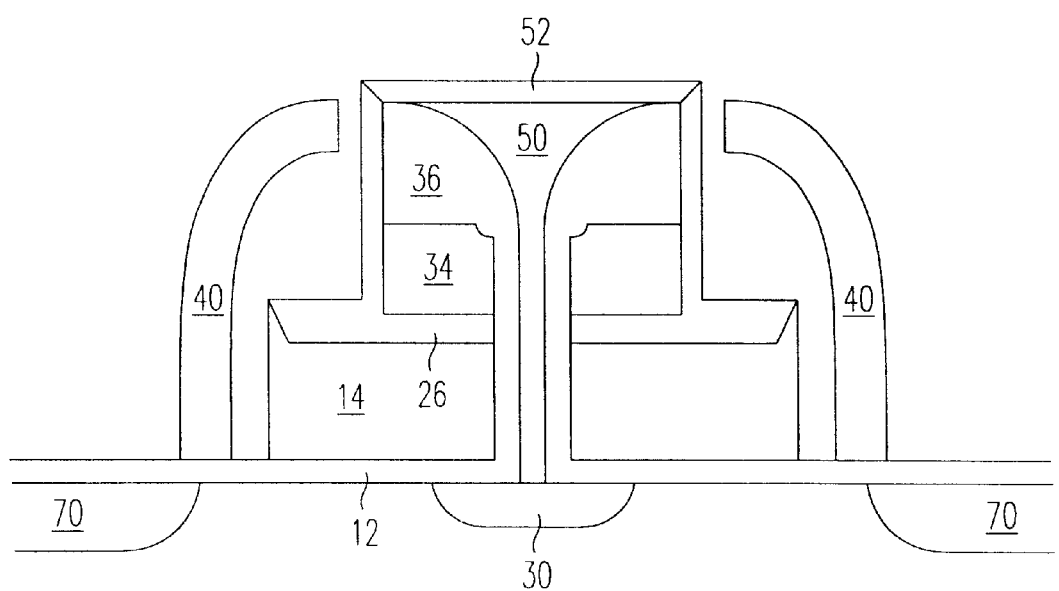

The difference between the non-volatile memory cell shown in FIG. 6i-4 and the non-volatile memory cell shown in FIG. 2i-4 is the addition of a second control gate 34. The second control gate 34 which is also parallel to the control gate 40 and to the source line 50, offers the ability to apply a different positive or negative voltage to capacitively couple to the floating gate 14 to enhance performance during various read or write. As a special case, the second control gate 34 can also be electrically connected to the source line 50 to provide greater capacitive coupling between the first region 30 and the floating gate 14.

The foregoing has described three self aligned methods to form non-volatile memory cell arrays of the floating gate memory cell type. By use of spacers to define the gate lengths, a uniform array of gates whose dimension is not limited by lithographic capability may be realized. In addition, by using polysilicon (or conductive) lines to connect to the first and second regions in the substrate (as opposed to source or drain lines in the substrate itself), the methods have provided for a unique manner to interconnect to semiconductor circuits, such as memory cells of any type, arranged in an array.

Figures 4, 7A:
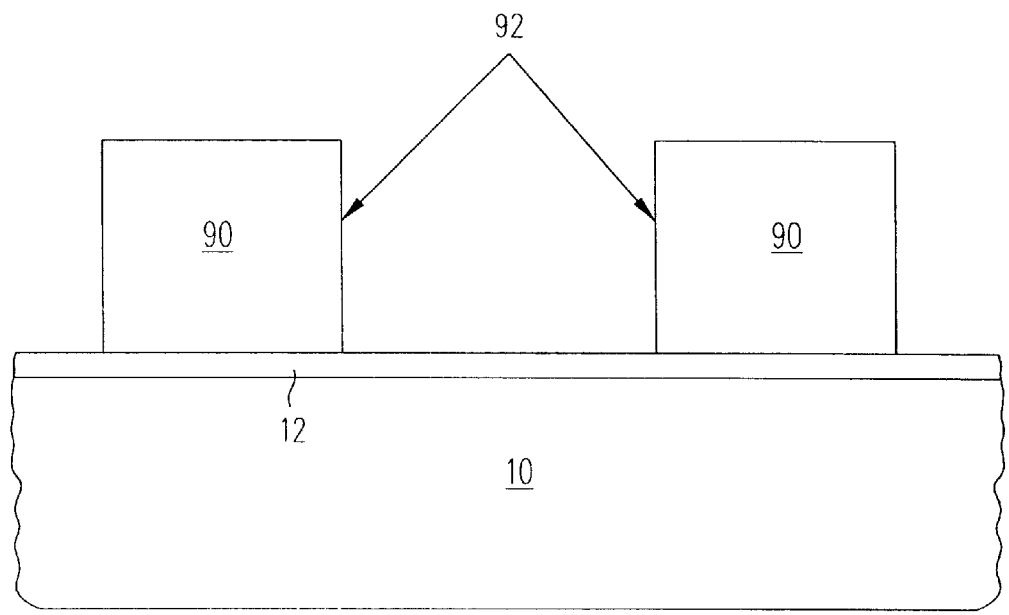

Referring to FIG. 7a-4, there is shown a cross sectional view taken along the line 4—4 showing the result of processing in which the structures 90 shown in FIG. 2e-4, 5c-4, or 6h-4 are formed. Although the starting structure of FIG. 7a-4 is the result of the processing shown in FIG. 2e-4, 5c-4, or 6h-4, it should be noted that it is not necessary that the structure 90 be formed by the methods described and leading to that shown in FIG. 2e-4, 5c-4, or 6h-4. It is only necessary that the structures 90 be spaced apart, substantially rectilinear, and have two vertical edges 92, with a "trench" between the structures 90. Further, the structures 90 need not be limited to non-volatile memory cells. For example, DRAM cells, SRAM cells or even logic cells that are arranged in an array of rows and columns, with word lines and bit lines to access each element 90 can be used as the starting point.

Furthermore, it is assumed that the structure 90 shown in FIG. 7a-4 is of the type not having a word line within the structure 90, such as the structure 90 shown in FIG. 2e-4. (Where a word line is within the structure 90, such as the embodiment 90 shown in FIG. 5c-4 or 6h-4, this will be discussed hereinafter.)

The structure 90 is then either oxidized or insulating material 92 is deposited so as to surround the structure 90. This can be done by the process shown and described in FIG. 2f-4. Of course if it is desired to electrically connect the structure 90 to the to-be-formed word lines, then this step may be eliminated.

A conductive gate material 40, such as polysilicon is deposited everywhere including the "trench" region, i.e. the region between the vertical walls 92 of adjacent structures 90. The polysilicon 40 is deposited by LPCVD. The polysilicon 40 will eventually form the word lines to the structures 90.

Figures 4, 7B:
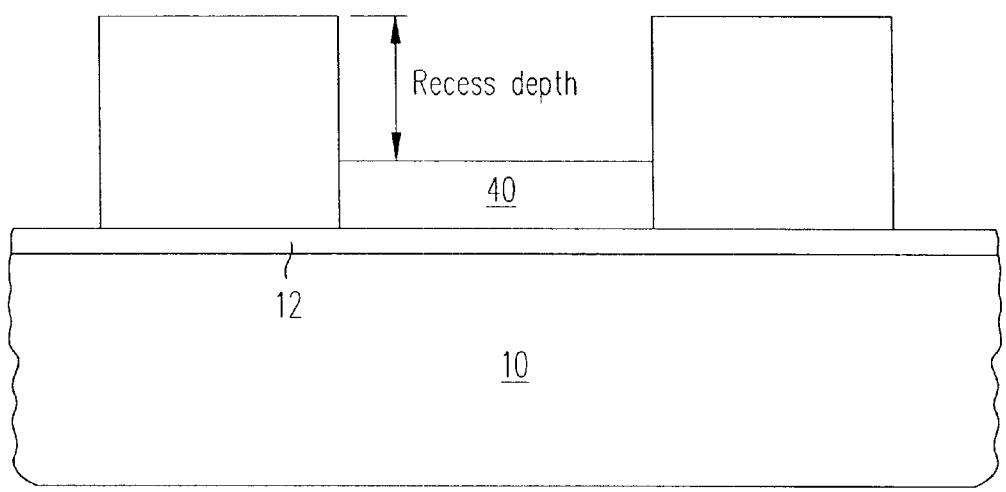

The polysilicon 40 is selectively removed with a topographically sensitive etch so as to leave polysilicon 40 recessed, in the "trench" region only. This can be done by a combination of CMP and RIE. As will be seen, the depth of the recess in the "trench" region is such that it allows the formation of spacers. The resultant structure is shown in FIG. 7b-4.

The polysilicon 40 may now be optionally metallized, i.e. silicide may be formed on the polysilicon 40. As is well known in the art the formation of silicide improves the electrical conductivity of the polysilicon 40. Since silicide processes have difficulty forming in narrow polysilicon lines, forming a silicide at this point in the process is easier than later when the row lines are at their final, narrow width.

Figures 4, 7C:
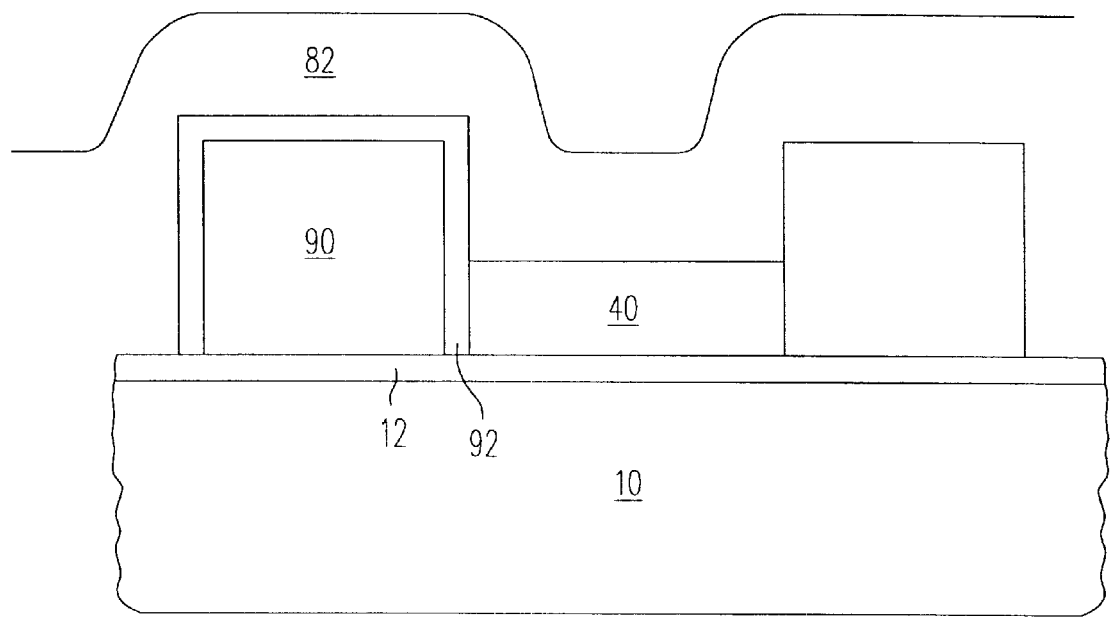

A dielectric material 82, such as silicon dioxide, is conformally deposited everywhere, using e.g. CVD process. The resultant structure is shown in FIG. 7c-4.

Figures 4, 7D:
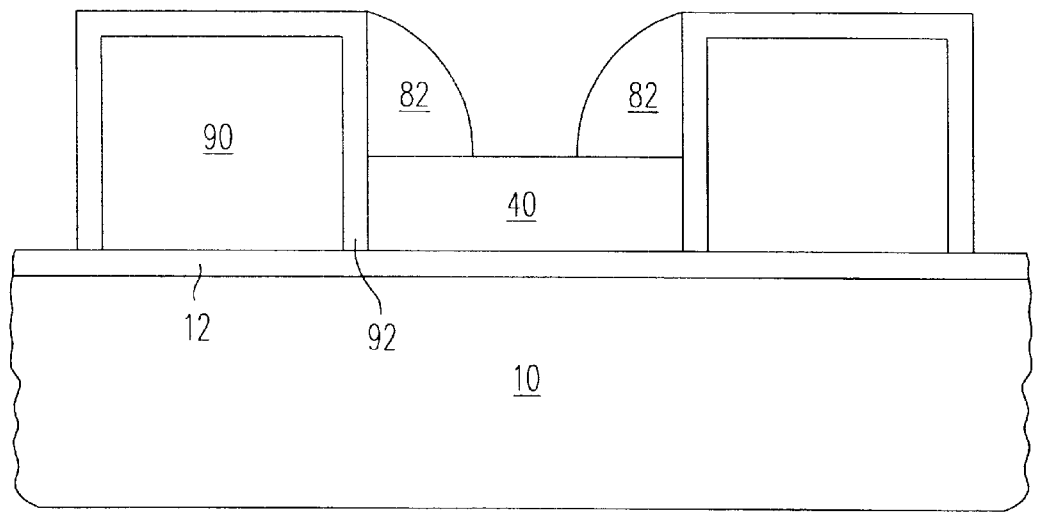

The silicon dioxide 82 is anisotropically etched resulting in the structure shown in FIG. 7d-4.

The polysilicon 40 is then etched using the silicon dioxide 82 as a "hard mask". Ion implantation is then performed through the layer 12 to form the second region 70. The resultant structure is shown in FIG. 7e-4.

Figures 4, 7E:
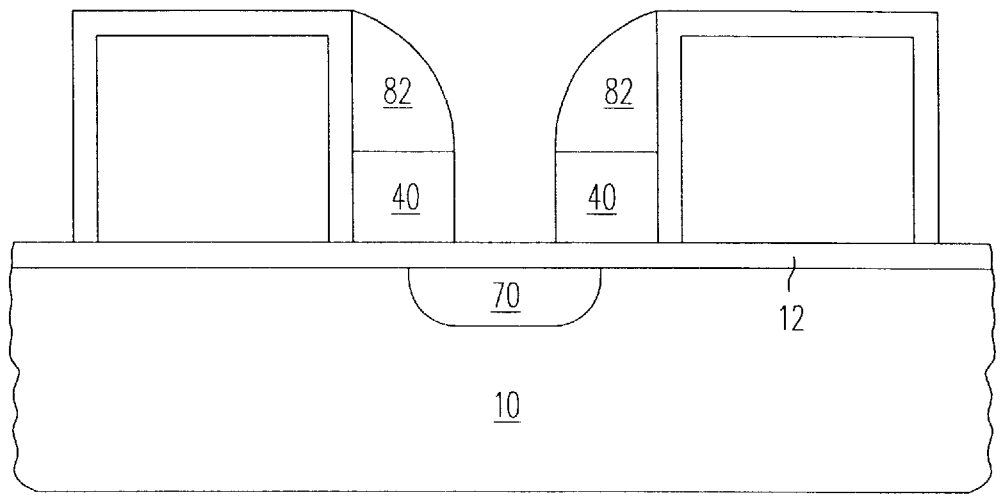

The structure shown in FIG. 7e-4 can further be processed by one of two methods: self-aligned and non self-aligned.

Figures 4, 7F:
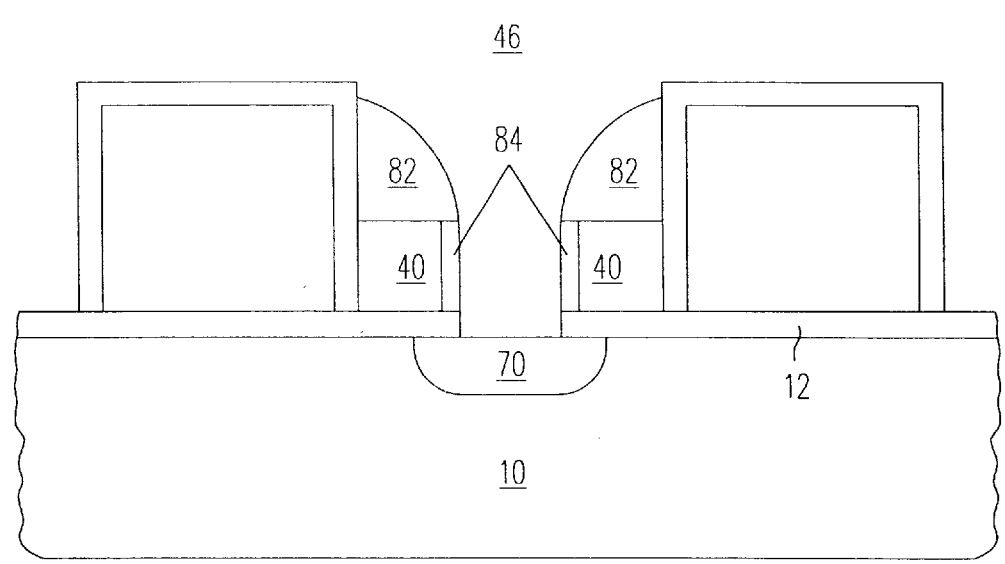

For the self aligned process, the structure shown in FIG. 7e-4 is then oxidized, so that the exposed regions of the polysilicon 40 form silicon dioxide 84. The structure is then anisotropically etched until the substrate 10 is exposed. It should be noted that in the preferred embodiment, layer 82, 84 and 12 are all of the same material, namely silicon dioxide. A bit line plug 46 connects the bit line 46 to the second region 70. The resultant structure is shown in FIG. 7f-4. Thus the structure shown in FIG. 7f-4 is a self-aligned bit line structure, which is self aligned with respect to the structure elements 90, with word lines 40 being formed of substantially rectilinear lines perpendicular to the bit lines 46.

For the non self-aligned method, which is conventional and is well known in the prior art, another layer of insulation is deposited over the structure shown in FIG. 7e-4. A hole is then created using a lithographic process through this insulation to the second region of the substrate 10. The hole is then filled with metal or conductor to form a contact with the second region 70.

As previously discussed, the structure 90 may or may not contain word lines within the structure 90. In the event the structure 90 contains word lines 40, such as the structures shown in FIG. 5c-4 or 6h-4, then it is not necessary to form the polysilicon lines 40, as shown and described for FIG. 7b-4. The polysilicon 40 may be replaced by a dielectric material similar or identical to the insulator 82, which is eventually deposited thereon. Alternatively, the insulator 82 may be conformally deposited everywhere, and then anisotropically etched to form the resultant structure shown in FIG. 7e-4.

Although the foregoing method described the use of polysilicon, it should be clear to those having ordinary skill in the art that any conductive material can be used. In addition, any insulator can be used in place of silicon dioxide. Finally, any material whose etch property differs from silicon dioxide (or any insulator) and from polysilicon (or any conductor) can be used in place of silicon nitride.

What is claimed is:

1. A self-aligned method of forming a semiconductor memory array of memory cells in a semiconductor substrate, each memory cell including a floating gate having a sharp tip, said method including the steps of:

forming a plurality of spaced apart isolation regions on said substrate, substantially parallel to one another in a first direction with an active region between each pair of adjacent isolation regions, each of said active regions comprising a first layer of insulating material on said semiconductor substrate, and a first layer of conductive material on said first layer of insulating material;

forming a plurality of spaced apart masking regions of a masking material substantially parallel to one another in a second direction on said active regions and said isolation regions, said second direction being substantially perpendicular to said first direction;

forming undercuts below said masking material along said second direction;

forming a plurality of spaced apart first spacers of an insulating material, substantially parallel to one another in said second direction, each first spacer being adjacent and contiguous to one of said masking regions with a first region between each pair of adjacent first spacers, each first spacer crossing a plurality of alternating active and isolation regions;

etching between pairs of first spacers in said first region, and through said conductive material;

removing said masking material; and anisotropically etching said conductive material, effective to form a plurality of spaced apart floating gates, each of said floating gates having a sharp tip.

2. The method of claim 1 further comprising the step of:

forming a plurality of control gates spaced apart from said floating gates.

3. The method of claim 2 wherein said conductive material comprises polysilicon.

4. The method of claim 2 wherein said undercuts are formed by isotropically etching said conductive material.

5. The method of claim 3 further comprising the steps of:

forming a plurality of first implant regions by ion implantation, each of said first implant regions being partially overlapped by a unique one of said floating gates; and forming a plurality of second implant regions by ion implantation, spaced apart from said first implant regions, each of said second implant regions being partially overlapped by a unique one of said control gates.

6. The method of claim 5 further comprising the steps of:

forming a first terminal in each of said first implant regions between pairs of adjacent first spacers; and forming a conductor in said second direction between each of said pairs of first spacers, electrically connecting each of said first terminals.

7. The method of claim 6 further comprising the steps of:

forming a second terminal in each of said second implant regions; and forming a conductor in said first direction, electrically connecting each of said second terminals.

8. The method of claim 3 wherein said control gates comprise a plurality of spaced apart second spacers of a conductive material, which are disposed in said second direction.

9. The method of claim 8 wherein said conductive material comprises polysilicon.

10. A self-aligned method of forming a semiconductor memory array of memory cells in a semiconductor substrate, each memory cell including a floating gate and a control gate, said method including the steps of:

forming a plurality of spaced apart isolation regions on said substrate, substantially parallel to one another in a first direction with an active region between each pair of adjacent isolation regions, each of said active regions comprising a first layer of insulating material on said semiconductor substrate, and a first layer of polysilicon material on said first layer of insulating material;

forming a plurality of spaced apart masking regions of a masking material substantially parallel to one another in a second direction on said active regions and said isolation regions, said second direction being substantially perpendicular to said first direction;

depositing a second layer of insulating material over said active and isolation regions;

depositing a second layer of conductive material over said second layer of insulating material;

etching said second layer of conductive material and said second layer of said insulating material using said masking material as an etch stop;

etching said second layer of conductive material between said masking regions until a predetermined thickness of said conductive material remains;

forming a plurality of spaced apart first spacers of an insulating material, substantially parallel to one another in said second direction, each first spacer being adjacent to one of said masking regions with a first region between each pair of adjacent first spacers, each first spacer crossing a plurality of alternating active and isolation regions;

etching between pairs of first spacers in said first region, and through said first and second layer of conductive material, and said first and second layer of insulating material;

removing said masking material; and anisotropically etching said conductive material, effective to form a plurality of spaced apart floating gates, and a plurality of control gates.

11. The method of claim 10 further comprising the step of forming an undercut below each side of said masking material along said second direction, before depositing a second layer of insulating material over said active and isolation regions, said undercuts being effective to cause said floating gates to be formed with a sharp tip.

12. The method of claim 11 wherein said undercuts are formed by isotropically etching said conductive material.

13. The method of claim 10 further comprising the step of:

forming a plurality of third gates spaced apart from said floating gates.

14. The method of claim 13 wherein said third gates each comprise first control gates, and said control gates each comprise second control gates for applying a different voltage to capacitively couple to said floating gates during read and write operations.

15. The method of claim 14 further comprising the steps of:

forming a plurality of first implant regions by ion implantation, each of said first implant regions being partially overlapped by a unique one of said floating gates; and forming a plurality of second implant regions by ion implantation, spaced apart from said first implant regions, each of said second implant regions being partially overlapped by a unique one of said first control gates.

16. The method of claim 15 further comprising the steps of:

forming a source line which is in ohmic contact with each of said first implant regions.

17. The method of claim 16 further comprising the step of electrically connecting said control gates to said source line.

18. The method of claim 13 wherein said third gates comprise a plurality of spaced apart second spacers of a conductive material, which are disposed in said second direction.

19. The method of claim 10 wherein said conductive material comprises polysilicon.

* * * * *